US010833138B2

United States Patent
Nendai et al.

(10) Patent No.: US 10,833,138 B2
(45) Date of Patent: Nov. 10, 2020

(54) ORGANIC EL DISPLAY PANEL AND PRODUCTION METHOD THEREFOR

(71) Applicant: JOLED INC., Tokyo (JP)

(72) Inventors: Kenichi Nendai, Tokyo (JP); Jiro Yamada, Tokyo (JP); Hideki Kobayashi, Tokyo (JP); Kazuma Teramoto, Tokyo (JP); Kaoru Abe, Tokyo (JP)

(73) Assignee: JOLED INC., Tokyo (JP)

( * ) Notice: Subject to any disclaimer, the term of this patent is extended or adjusted under 35 U.S.C. 154(b) by 7 days.

(21) Appl. No.: 16/307,941

(22) PCT Filed: Jun. 1, 2017

(86) PCT No.: PCT/JP2017/020385
§ 371 (c)(1),
(2) Date: Dec. 7, 2018

(87) PCT Pub. No.: WO2017/213012
PCT Pub. Date: Dec. 14, 2017

(65) Prior Publication Data
US 2019/0189715 A1    Jun. 20, 2019

(30) Foreign Application Priority Data

Jun. 9, 2016   (JP) .................. 2016-115089

(51) Int. Cl.
*H01L 27/32* (2006.01)
*H01L 51/52* (2006.01)
(Continued)

(52) U.S. Cl.
CPC ...... *H01L 27/3246* (2013.01); *H01L 51/5218* (2013.01); *H01L 51/5271* (2013.01);
(Continued)

(58) Field of Classification Search
CPC ............ H01L 27/3246; H01L 51/5218; H01L 51/5271; H01L 51/5275
See application file for complete search history.

(56) References Cited

U.S. PATENT DOCUMENTS 5,443,922 A    8/1995 Nishizaki et al.
2001/0023661 A1    9/2001 Hiroki et al.
(Continued)

FOREIGN PATENT DOCUMENTS

EP    1122801 A2    8/2001
JP    H5-163488 A    6/1993
(Continued)

*Primary Examiner* — Matthew L Reames
(74) *Attorney, Agent, or Firm* — Hauptman Ham, LLP

(57) ABSTRACT

An organic electroluminescence (EL) display panel having pixels arranged in a matrix of rows and columns includes: a substrate; pixel electrode layers that are made of a light-reflective material and are arranged on the substrate in the matrix; an insulating layer that is provided above the substrate and the pixel electrode layers; organic functional layers that are provided above the pixel electrode layers; and a light-transmissive counter electrode layer that is provided above the organic functional layers, wherein the insulating layer has a first opening and second openings for each of the pixel electrode layers, the first opening being elongated in a column direction, the second openings each being shorter than the first opening in the column direction and being lined up adjacent to the first opening, and the organic functional layers include light-emitting layers in which organic electroluminescence occurs in the first opening and the second openings.

7 Claims, 20 Drawing Sheets

(51) Int. Cl.
*H01L 51/00* (2006.01)
*H01L 51/50* (2006.01)

(52) U.S. Cl.
CPC ........ *H01L 51/5275* (2013.01); *H01L 27/322* (2013.01); *H01L 27/3211* (2013.01); *H01L 27/3248* (2013.01); *H01L 51/0005* (2013.01); *H01L 51/5012* (2013.01); *H01L 51/5284* (2013.01); *H01L 2227/323* (2013.01); *H01L 2251/5315* (2013.01); *H01L 2251/558* (2013.01)

(56) References Cited

U.S. PATENT DOCUMENTS

| | | |
|---|---|---|
| 2005/0285509 A1 | 12/2005 | Funamoto et al. |
| 2006/0152559 A1 | 7/2006 | Sakai et al. |
| 2007/0075618 A1 | 4/2007 | Mitsuya |
| 2013/0214301 A1 | 8/2013 | Yamada et al. |
| 2013/0320388 A1 | 12/2013 | Sekimoto |
| 2014/0151651 A1* | 6/2014 | Jin ............... H01L 51/5209 257/40 |
| 2014/0306200 A1 | 10/2014 | Jinta et al. |
| 2015/0188091 A1 | 7/2015 | Kudo et al. |

FOREIGN PATENT DOCUMENTS

| | | |
|---|---|---|
| JP | 2004-351305 A | 12/2004 |
| JP | 2005-276803 A | 10/2005 |
| JP | 2006-194921 A | 7/2006 |
| JP | 2007-49173 A | 2/2007 |
| JP | 2007-95614 A | 4/2007 |
| JP | 2007-95729 A | 4/2007 |
| JP | 2008-91051 A | 4/2008 |
| JP | 2008-243648 A | 10/2008 |
| JP | 2009-277570 A | 11/2009 |
| JP | 2011-170249 A | 9/2011 |
| JP | 2012-38739 A | 2/2012 |
| JP | 2013-89293 A | 5/2013 |
| JP | 2013-191533 A | 9/2013 |
| JP | 2013-240733 A | 12/2013 |
| JP | 2014-207105 A | 10/2014 |
| JP | 2015-144107 A | 8/2015 |
| JP | 2015-223813 A | 12/2015 |
| WO | 2013/179355 A1 | 12/2013 |

* cited by examiner

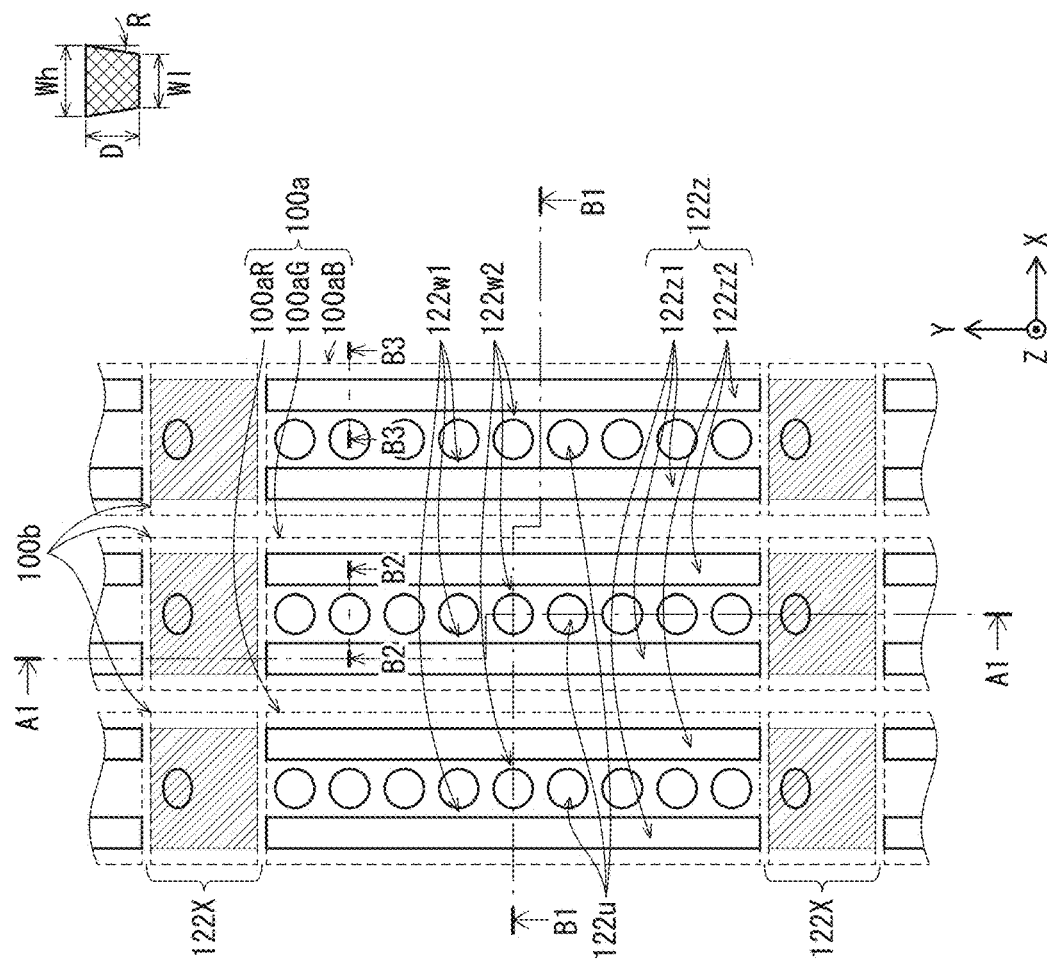
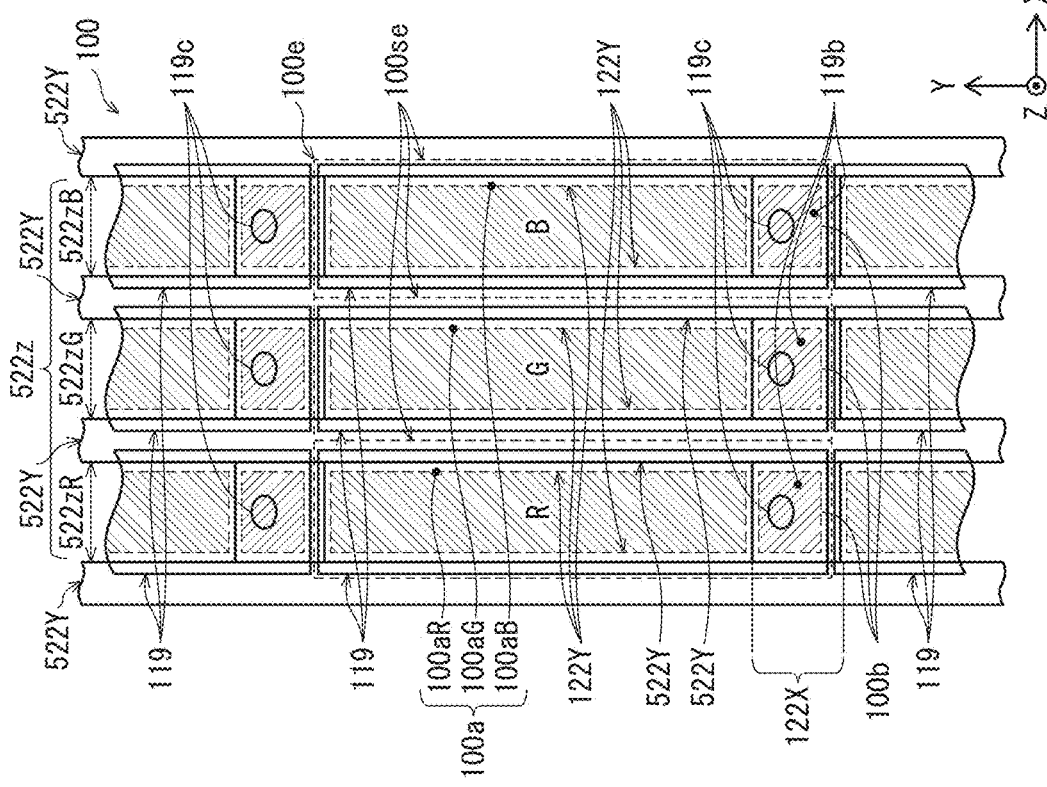

FIG. 17

| Sample | Height of bars 122w | Ink spread rate | Luminance magnification |
|---|---|---|---|
| Example 1 | 60%-70% of 122Y | 100% | 1.47 |
| Example 2 | Equal to 122Y | 75% | 1.47 |

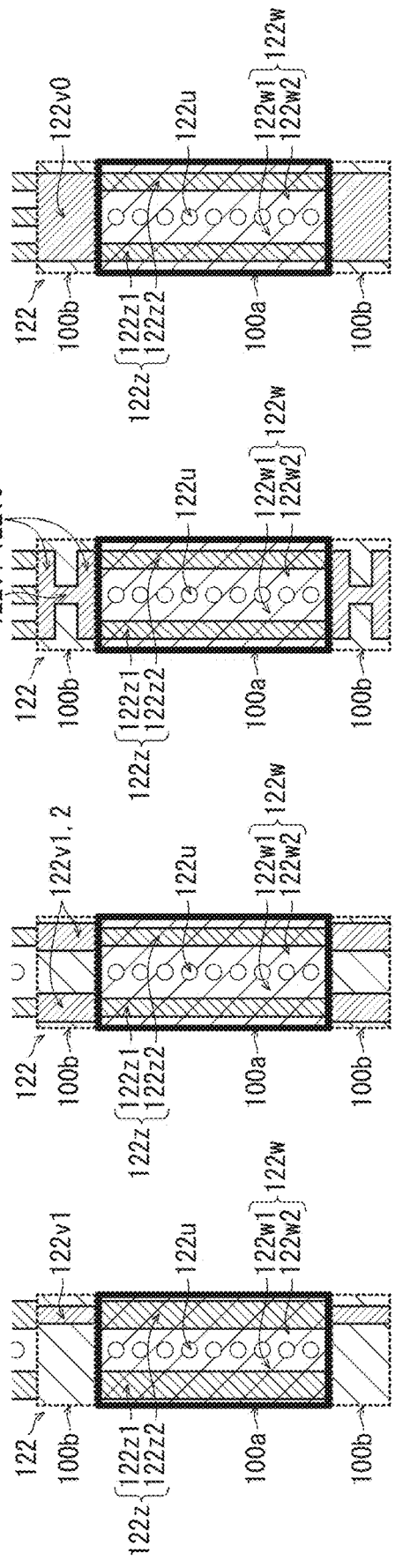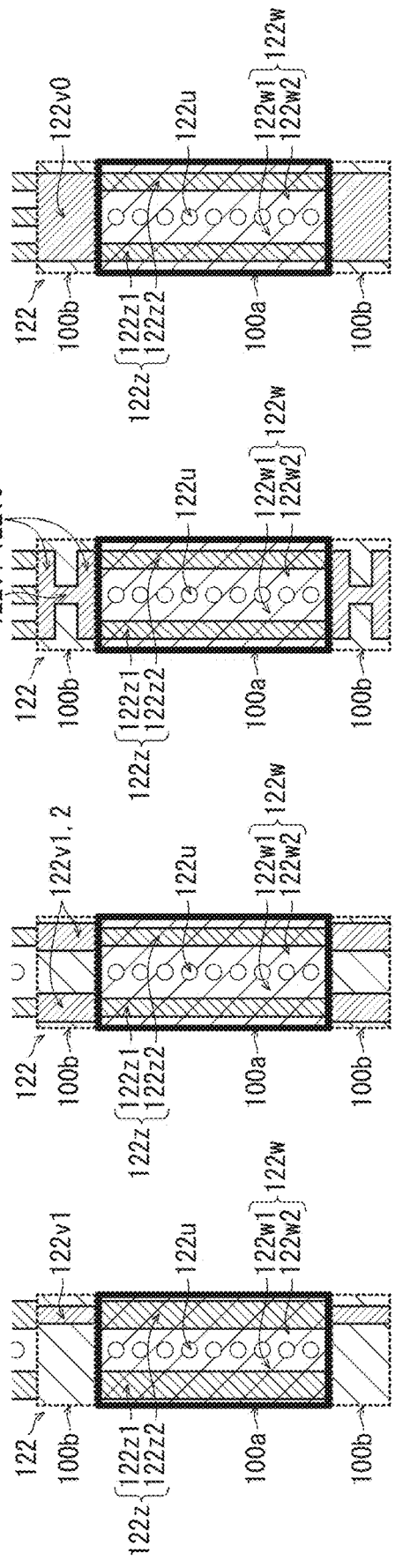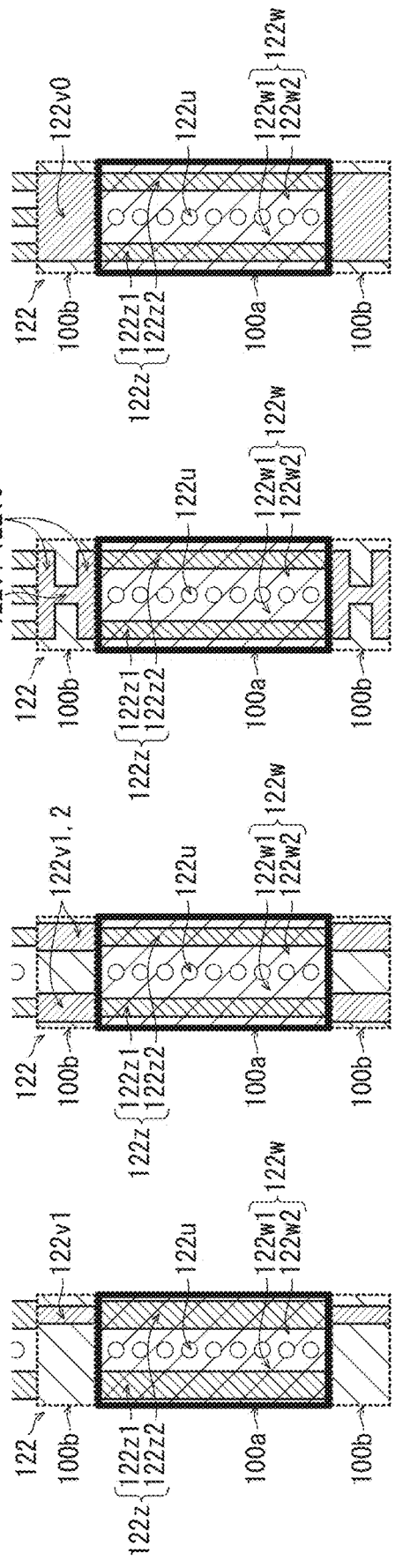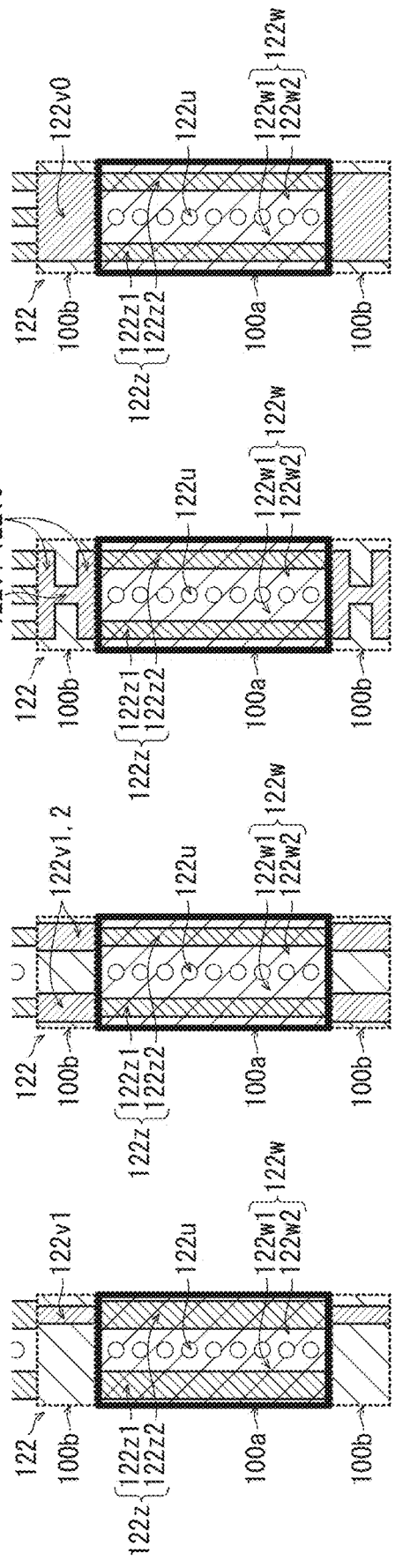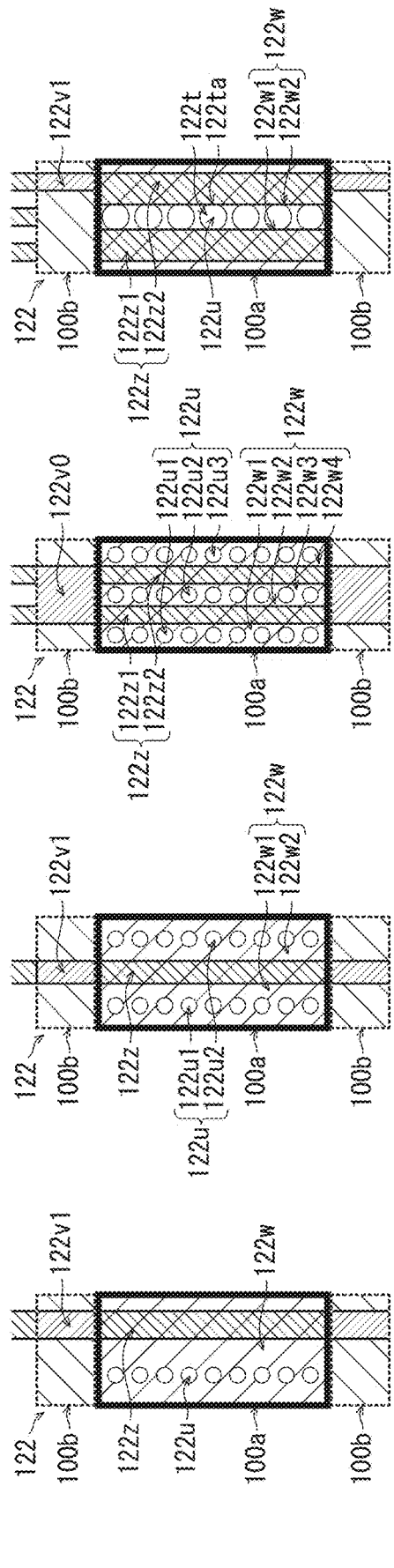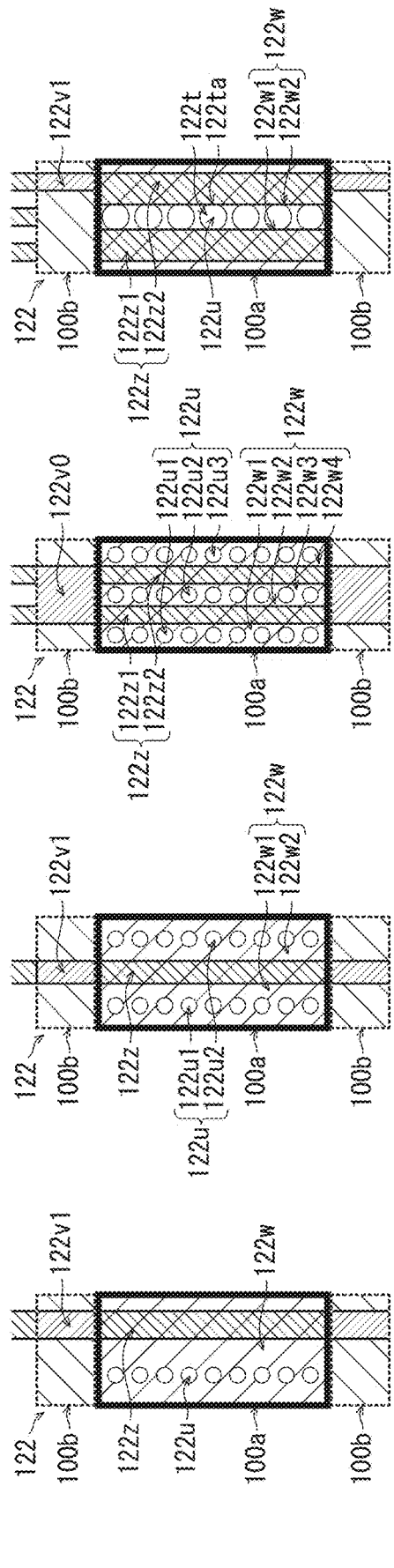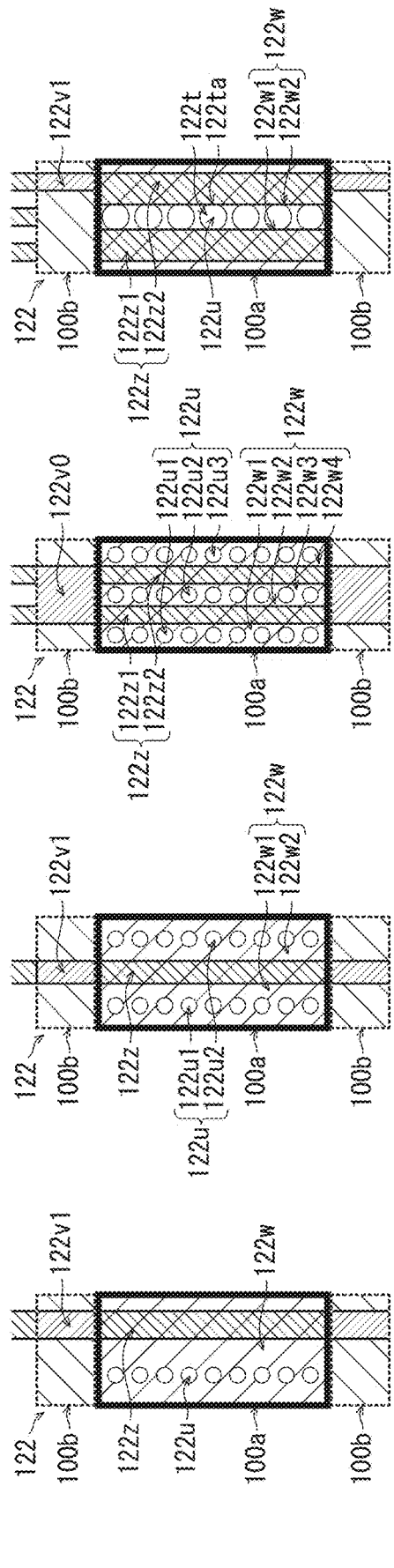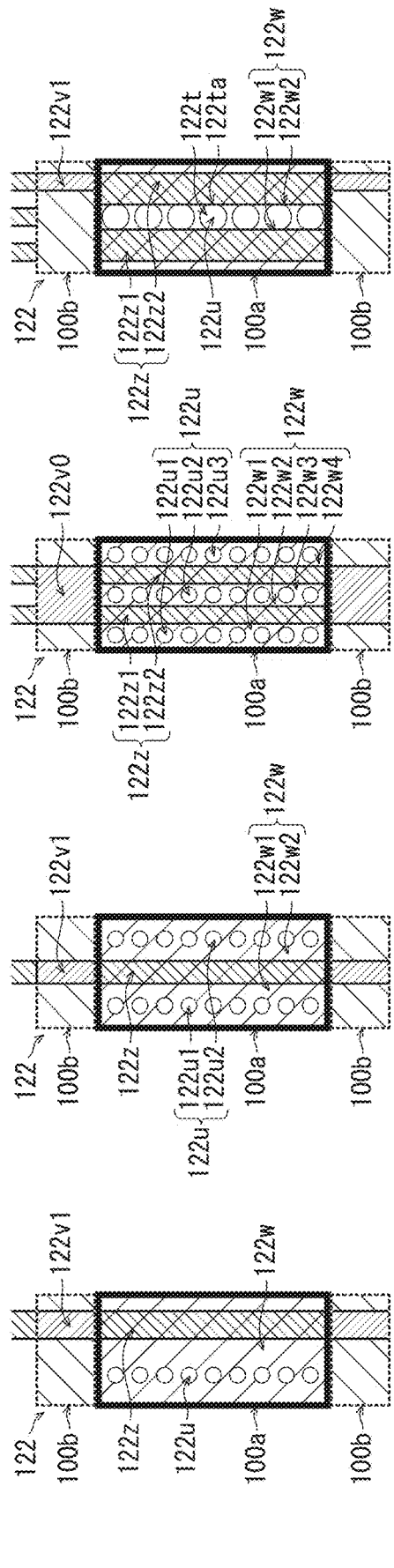

FIG. 20

| Sample | Ink spread rate | Luminance magnification |
|--------|-----------------|-------------------------|
| A      | 24%             | 1.6                     |
| B      | 75%             | 1.4                     |

ORGANIC EL DISPLAY PANEL AND PRODUCTION METHOD THEREFOR

RELATED APPLICATIONS

The present application is a National Phase of International Application Number PCT/JP2017/020385, filed Jun. 1, 2017, which claims priority to JP2016-115089 filed Jun. 9, 2016.

TECHNICAL FIELD

The present disclosure relates to organic electroluminescence (EL) display panels that use organic EL elements employing electroluminescence of organic material, and to a method of manufacturing the same.

BACKGROUND ART

In recent years, organic EL display panels including a matrix of organic EL elements arranged above a substrate have been put into practical use, as display panels for use in display devices such as digital televisions. Such organic EL display panels achieve high visibility due to the organic EL elements being self-luminous. In the organic EL display panels, each organic EL element has a basic configuration in which a light emitting layer containing an organic light emitting material is disposed between an electrode pair of an anode and a cathode, and when driven, a voltage is applied between the electrode pair and light is emitted through recombination of holes injected to the light emitting layer from the anode and electrons injected to the light emitting layer from the cathode.

In the organic EL display panels, there has been a demand for improving a light extraction efficiency of the organic EL elements from the standpoint of reducing power consumption, increasing the panel service life, and so on.

In response to this demand, display devices proposed in Patent Literatures 1 and 2 for example include: a reflector (reflective structure), which is constituted from first members of a concave shape and second members that are each placed between two adjacent first members; and an organic light emitting layer, which is provided between the first members and the second members. The proposed display devices exhibit an improved light extraction efficiency owing to the first members and the second members having refractive indices within a predetermined range.

CITATION LIST

Patent Literature

[Patent Literature 1]
  Japanese Patent Application Publication No. 2013-191533
[Patent Literature 2]
  Japanese Patent Application Publication No. 2015-144107
[Patent Literature 3]
  Japanese Patent Application Publication No. 2013-240733

SUMMARY

Technical Problem

According to the techniques described in Patent Literatures 1 and 2, however, when a low-cost ink application method such as an ink jet method (Patent Literature 3 for example) is used for constituting a reflector including organic light emitting layers, failure sometimes occurs such as an insufficient ink spread. This is due to the concave first members that are provided on surfaces of pixel electrodes onto which an ink containing light emitting layer materials is to be applied. Such an insufficient ink spread results in difficulties in performing uniform ink application in each pixel, and thus film thickness of the formed light emitting layer is ununiform within the pixel. This causes a problem that film thickness of the formed light emitting layers is ununiform within the pixel, and thus luminance unevenness occurs, and luminous efficiency and panel service life deteriorate.

The present disclosure was made in view of the above problem, and aims to provide an organic EL display panel and a manufacturing method of the same that maintain a high luminous efficiency and uniformize film thickness of light emitting layers in each pixel to suppress luminance unevenness, with a low-cost ink application method for a reflector having a high light extraction efficiency.

Solution

One aspect of the present disclosure provides an organic electroluminescence (EL) display panel including pixels arranged in a matrix of rows and columns, the organic EL display panel comprising: a substrate; pixel electrode layers that are made of a light-reflective material and are arranged on the substrate in the matrix; an insulating layer that is provided above the substrate and the pixel electrode layers; organic functional layers that are provided above the pixel electrode layers; and a light-transmissive counter electrode layer that is provided above the organic functional layers, wherein the insulating layer has a first opening and second openings for each of the pixel electrode layers, the first opening being elongated in a column direction, the second openings each being shorter than the first opening in the column direction and being lined up adjacent to the first opening, and the organic functional layers include light emitting layers in which organic electroluminescence occurs in the first opening and the second openings.

Advantageous Effects

According to the organic EL display panel and the manufacturing method of the same relating to the one aspect of the present disclosure, it is possible to maintain a high luminous efficiency and uniformize film thickness of light emitting layers in each pixel to suppress luminance unevenness in an organic display panel having a reflector including application-type functional layers.

BRIEF DESCRIPTION OF DRAWINGS

FIG. 4A is an enlarged plan view of a portion X1 in FIG. 3, FIG. 4B is an enlarged plan view of the portion X1 viewed from above an insulating layer 122, and FIG. 4C is a schematic cross-sectional view of an opening taken along a line B2-B2 in FIG. 4B.

FIG. 17 shows measurement results of ink spread rate and calculated values of luminance magnification with respect to light emitting layers in subpixels in organic EL display panels relating to examples.

FIGS. 18A to 18H are enlarged plan views of a subpixel relating to a modification.

FIG. 20 shows measurement results of ink spread rate and calculated values of luminance magnification with respect to light emitting layers in subpixels in the organic EL display panel relating to the inventors' conception.

DESCRIPTION OF EMBODIMENTS

<<Process by which One Aspect of the Present Disclosure was Achieved>>

The inventors considered a problem in manufacturing of organic EL display panels (hereinafter referred to just as display panels). The following describes the problem with reference to the drawings.

According to the organic EL display devices described in Patent Literatures 1 and 2, as described above, in the case where a low-cost ink application method such as an ink jet method is used for forming organic light emitting layers, uniform ink application in each pixel is difficult due to the concave first members, which are provided on the pixel electrodes onto which the ink containing light emitting layer materials is to be applied. As a result, the ink insufficiently spreads in the pixel, and this causes a problem that the film thickness of the light emitting layers is ununiform and thus luminance unevenness occurs.

In response to this problem, the inventors performed a test with use of their conceived test display panel in order to suppress an insufficient ink spread in each pixel during a manufacturing process. The following provides comparative description of a reflector of the inventors' conceived test display panel with a conventional reflector in terms of light extraction efficiency and ink spread with reference to FIGS. 19A, 19B, and 20.

Figure 19A:
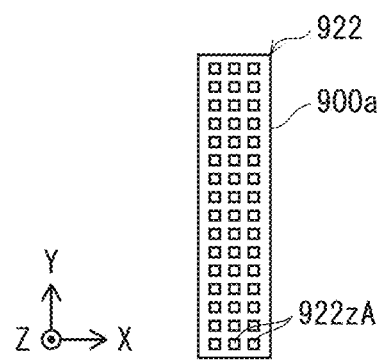
FIGS. 19A and 19B are plan views of an insulating layer 922 corresponding to a subpixel of an organic EL display panel relating to the inventors' conception.
Figure 19B:
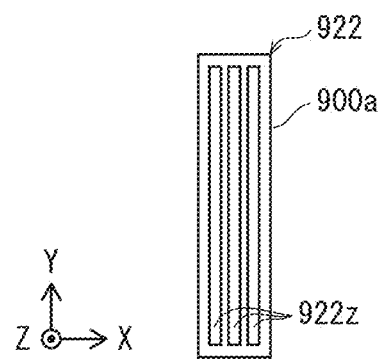

FIGS. 19A and 19B are plan views of an insulating layer 922 corresponding to a subpixel region 900a of the display panel relating to the inventors' conception.

FIG. 19A shows a subpixel with a reflector of the display panel where truncated conical openings 922zA are provided in the insulating layer 922 (the subpixel is hereinafter referred to as Sample A). Specifically, as shown in FIG. 19A, 48 openings 922zA are provided such that three rows of openings 922zA are arranged in regular intervals in an X-direction and 16 rows of openings 922zA are arranged in regular intervals in a Y-direction. A region including the 48 openings 922zA constitutes a luminous region. The openings 922zA of Sample A have a width in a column direction and a width in a row direction that are equal to each other (1:1).

FIG. 19B shows a subpixel with a reflector of the display panel where three elongated openings 922z, which extend in the Y-direction, are arranged in the insulating layer 922 (the subpixel is hereinafter referred to as Sample B). The openings 922z have a width in the column direction 20 times a width in the row direction (20:1). Note that Samples A and B are equal to each other in terms of pixel shape and size.

First, evaluation of light extraction efficiency was performed by calculation of luminance magnification of Samples A and B.

FIG. 20 shows, in a right column, calculated values of luminance magnification for subpixels. The luminance magnification indicates a luminance value of each sample relative to that of planar subpixels of the same size with no reflector.

As shown in FIG. 20, while Sample A exhibits luminance magnification of 1.6, Sample B exhibits luminance magnification of 1.4. It is true that the luminance magnification of Sample B is low compared with that of Sample A, but its ratio to that of Sample A is only approximate 1.4/1.6. Accordingly, the luminance magnification of Sample B is not low enough to damage effects of the reflector.

This seems to be because of the following reason. The light extraction efficiency of the reflector increases with an increase in area of slopes surrounding the openings 922z functioning as the reflective structure. Due to this, the light extraction efficiency increases with a decrease in difference between the width in the column direction and the width in the row direction of the openings. Accordingly, Sample A functions as a preferable reflector and thus exhibits a high light extraction efficiency. Compared with this, Sample B has bars, which extend in the row direction in the insulating layer 922, only at both ends of the subpixel in the column direction. Accordingly, Sample B has small-area slopes extending in the row direction and thus exhibits a lower light extraction efficiency than Sample A. On the other hand, Sample B is larger than Sample A both in terms of area of luminous region in the column direction and area of slopes extending in the column direction. This seems to be the reason why the light extraction efficiency of Sample B is not impaired greatly.

Next, regarding the ink spread, the inventors performed a test of forming functional layers using inks of the same amount in order to measure an ink spread rate based on a ratio of an area of the functional layers to an area of the subpixel region 900a. FIG. 20 shows, in a middle column, a measurement result of the ink spread rate for the light emitting layers in the subpixels. As shown in FIG. 20, while Sample A exhibits an ink spread rate of 24%, Sample B exhibits an ink spread rate of 75%, which is drastically higher than Sample A.

This seems to be because of the following reasons. In Sample A, the number and the area of the bars between the openings 922zA are both large, and this hinders the flow of the ink. Also, the area of the openings 922zA is small. Due to this, when an ink is dropped onto the subpixel, air in the openings 922zA cannot easily escape. This seems to be the reason why the spread of the ink over the subpixel is difficult in Sample A. In Sample B compared with this, the openings 922z have therebetween no bar that hinders the flow of the ink in the column direction, and thus the ink easily flows in the column direction. Further, the openings 922z are elongated and extend in the column direction. Due to this, air in the openings 922z easily flows in the column direction, and thus does not hinder the flow of the ink so much. This seems to be the reason why Sample B exhibits an ink spread rate, which is drastically higher than Sample A.

In view of the above test results, the inventors earnestly considered a reflector that is capable of improving the light extraction efficiency of organic EL elements and improving the ink spread rate in pixels in a process of applying an ink containing light emitting layer materials in the pixels. As a result, the inventors conceived of the display panel described in the embodiment of the present disclosure.

<<Aspects of the Present Disclosure>>

One aspect of the present disclosure provides an organic electroluminescence (EL) display panel including pixels arranged in a matrix of rows and columns, the organic EL display panel comprising: a substrate; pixel electrode layers that are made of a light-reflective material and are arranged on the substrate in the matrix; an insulating layer that is provided above the substrate and the pixel electrode layers; organic functional layers that are provided above the pixel electrode layers; and a light-transmissive counter electrode layer that is provided above the organic functional layers, wherein the insulating layer has a first opening and second openings for each of the pixel electrode layers, the first opening being elongated in a column direction, the second openings each being shorter than the first opening in the column direction and being lined up adjacent to the first opening, and the organic functional layers include light emitting layers in which organic electroluminescence occurs in the first opening and the second openings.

With this configuration, it is possible to maintain a high luminous efficiency and uniformize film thickness of light emitting layers in each pixel to suppress luminance unevenness, with a low-cost ink application method for a reflector.

Also, in the above aspect, for each of the pixels, an upper edge of a wall of each of the second openings that is away from an outer edge of the pixel in a row direction may be lower in height than one of an upper edge of a wall of the first opening and an upper edge of a wall of each of the second openings that are nearest the outer edge in the row direction.

With this configuration, the height of bars, which hinder an ink flow in the row direction, is low, and this facilitates the ink flow in the row direction. Thus, an ink spreads in the first opening 122z in the column direction, and then further spreads therefrom in the row direction. As a result, the ink spreads over the entire subpixel region 900a. This uniformizes the film thickness of the light emitting layers in each pixel to suppress luminance unevenness.

Also, in any of the above aspects, for each of the pixels, one of a wall of the first opening and a wall of each of the second openings that are away from an outer edge of the pixel in a row direction may be larger in gradient than one of a wall of the first opening and a wall of each of the second openings that are nearest the outer edge in the row direction.

With this configuration, it is possible to improve the light extraction efficiency in the first openings 122z on the inner side in the subpixels 100se, and increase the viewing angle in the first openings 122z on the nearest side to the outer edges of the subpixels 100se, thereby to cause the light emitting layers 123 to efficiently emit light upward.

Also, in any of the above aspects, the insulating layer may further have a third opening for each of the pixel electrode layers, the third opening being elongated in the column direction, the second openings may be disposed between the first opening and the third opening in a row direction, an upper edge of a wall of the first opening that is adjacent to the second openings in the row direction may be lower in height than an upper edge of a wall of the first opening that faces the wall of the first opening that is adjacent to the second openings in the row direction, and an upper edge of a wall of the third opening that is adjacent to the second openings in the row direction may be lower in height than an upper edge of a wall of the third opening that faces the wall of the third opening that is adjacent to the second openings in the row direction.

With this configuration, it is possible to maintain a high luminous efficiency and uniformize the film thickness of the light emitting layers in each pixel to suppress luminance unevenness.

Also, in any of the above aspects, the wall of the first opening that faces the adjacent wall of the first opening may be smaller in gradient than the wall of the first opening that is adjacent to the second openings, and the wall of the third opening that faces the adjacent wall of the third opening may be smaller in gradient than the wall of the third opening that is adjacent to the second openings.

With this configuration, the height of bars, which hinder an ink flow in the row direction, is low, and this facilitates the ink flow in the row direction. As a result, the ink spreads over the entire subpixel region 900a, and this uniformizes the film thickness of the light emitting layers in each pixel to suppress luminance unevenness.

Also, in any of the above aspects, the first opening and the third opening may have a width in the row direction that increases upward, and the second openings may have a width in the row direction and a width in the column direction that increase upward.

With this configuration, it is possible to improve the light extraction efficiency and increase the viewing angle.

Also, in any of the above aspects, the organic EL display panel may further comprise a bond layer that is provided above the counter electrode layer and has a rear surface that is convex along the first, second, and third openings, and when refractive indices of the bond layer and the insulating layer are represented by $n_1$ and $n_2$, respectively, the following relationships may be satisfied: $1.1 \leq n_1 \leq 1.8$ (Formula 1); and $|n_1-n_2| \geq 0.20$ (Formula 2).

With this configuration, it is possible to improve the light extraction efficiency of the light emitting layers as the reflector by the openings provided in the insulating layer.

Also, in any of the above aspects, when depth, upper width in the row direction, and lower width in the row direction of the first, second, and third openings are represented by D, $W_h$, and $W_1$, respectively, the following relationships may be satisfied: $0.5 \leq W_1/W_h \leq 0.8$ (Formula 3); and $0.5 \leq D/W_1 \leq 2.0$ (Formula 4).

With this configuration, the openings have trapezoidal cross sections taken along the row direction whose width increases upward, and thus light emitting layers efficiently emit light upward.

Also, in any of the above aspects, in plan view, regions of the substrate where the first and second openings are provided may be luminous regions in the pixels, regions of the substrate that are each arranged between two adjacent of the luminous regions in the column direction may be non-luminous regions in the pixels, and the insulating layer may further have, in each of the non-luminous regions, a grooved portion with an upper opening and a bottom, the grooved portion being communicated with the first openings in two pixels that are adjacent to the non-luminous region in the column direction.

With this configuration, connection grooves included in the grooved portions increase the flow of the ink, which contains materials of the light emitting layers, in the column direction, to suppress variation in application amount of the ink between the subpixels. This reduces variation in film thickness of the light emitting layers to suppress luminance unevenness between the subpixels.

Also, in any of the above aspects, the organic functional layers may be in contact with the pixel electrode layers in the first, second, and third openings, and may be separated from the pixel electrode layers in the grooved portions.

With this configuration, the hole injection layers are exposed in the openings so as to be in contact with the hole transport layer, and this allows electrical charge supply in the openings from the hole injection layers to the hole transport layer. Thus, the openings correspond to the luminous regions. The hole injection layers are not exposed in bridging grooves and connection grooves included in the grooved portions of the insulating layer, which have groove-shaped cross sections and have upper openings and bottoms. Accordingly, electrical charge supply from the hole injection layers to the hole transport layer is not performed in the grooved portions. Thus, the grooved portions correspond to the non-luminous regions.

DESCRIPTION OF EMBODIMENTS

1 Circuit Configuration
1.1 Circuit Configuration of Display Device 1

The following describes circuit configuration of an organic EL display device 1 (hereinafter referred to just as display device 1) relating to an embodiment, with reference to FIG. 1.

Figure 1:
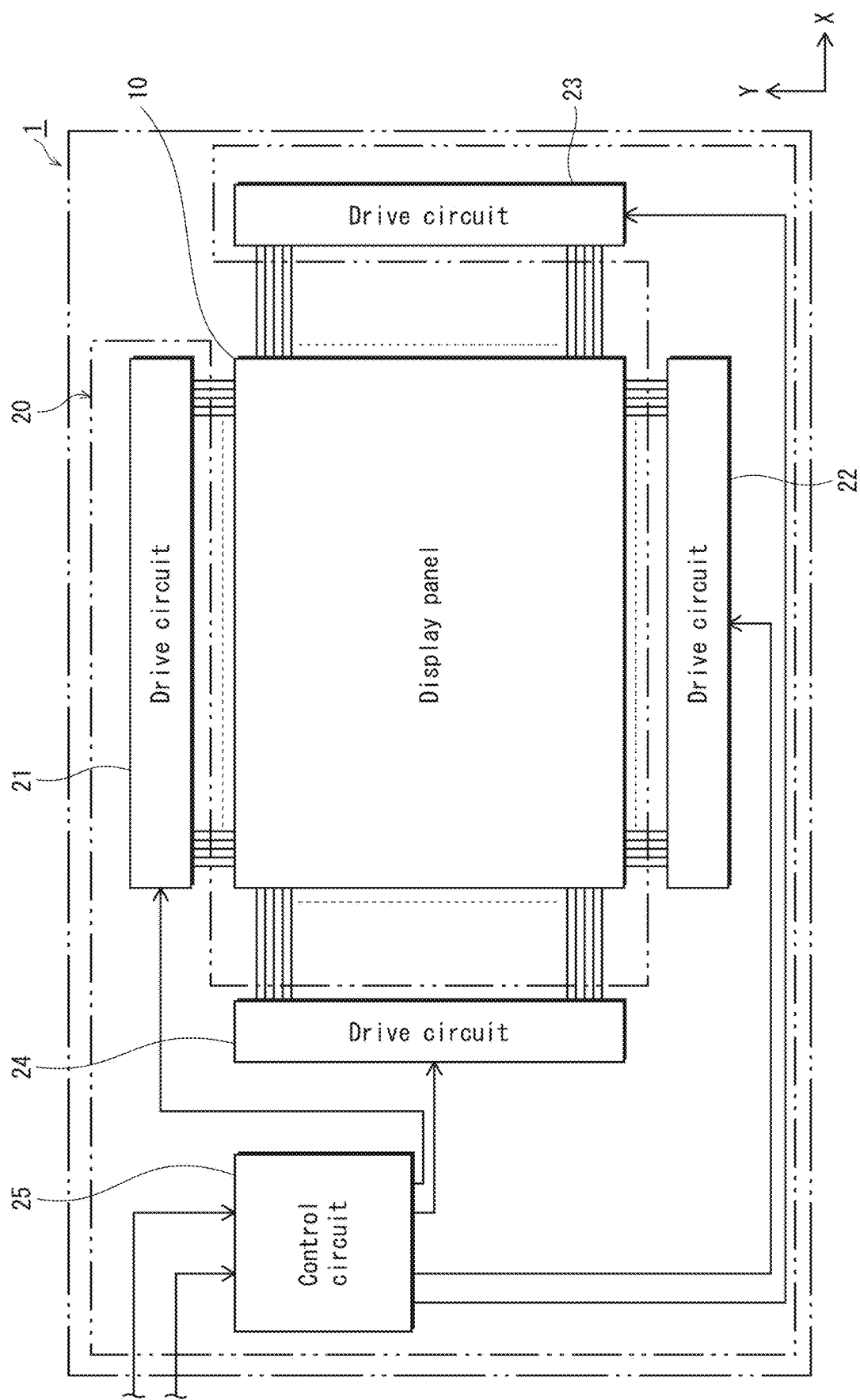
FIG. 1 is a schematic block diagram of circuit configuration of an organic EL display device 1 relating to an embodiment of the present disclosure.

As shown in FIG. 1, the display device 1 includes an organic EL display panel 10 (hereinafter referred to just as display panel 10) and a drive control circuit unit 20 connected thereto.

The display panel 10 is an organic EL panel that makes use of electroluminescence of organic material, in which organic EL elements are arranged in a matrix, for example. The drive control circuit unit 20 includes four drive circuits 21-24 and a control circuit 25.

The arrangement of the circuits of the drive control circuit unit 20 with respect to the display panel 10 in the display device 1 is not limited to the configuration shown in FIG. 1.

1.2 Circuit Configuration of Display Panel 10

The display panel 10 includes a plurality organic EL elements that are unit pixels 100e each of which are composed of three-color subpixels (not shown) emitting light of red (R), green (G), and blue (B) colors. Circuit configuration of the subpixels 100se is described with reference to FIG. 2.

Figure 2:
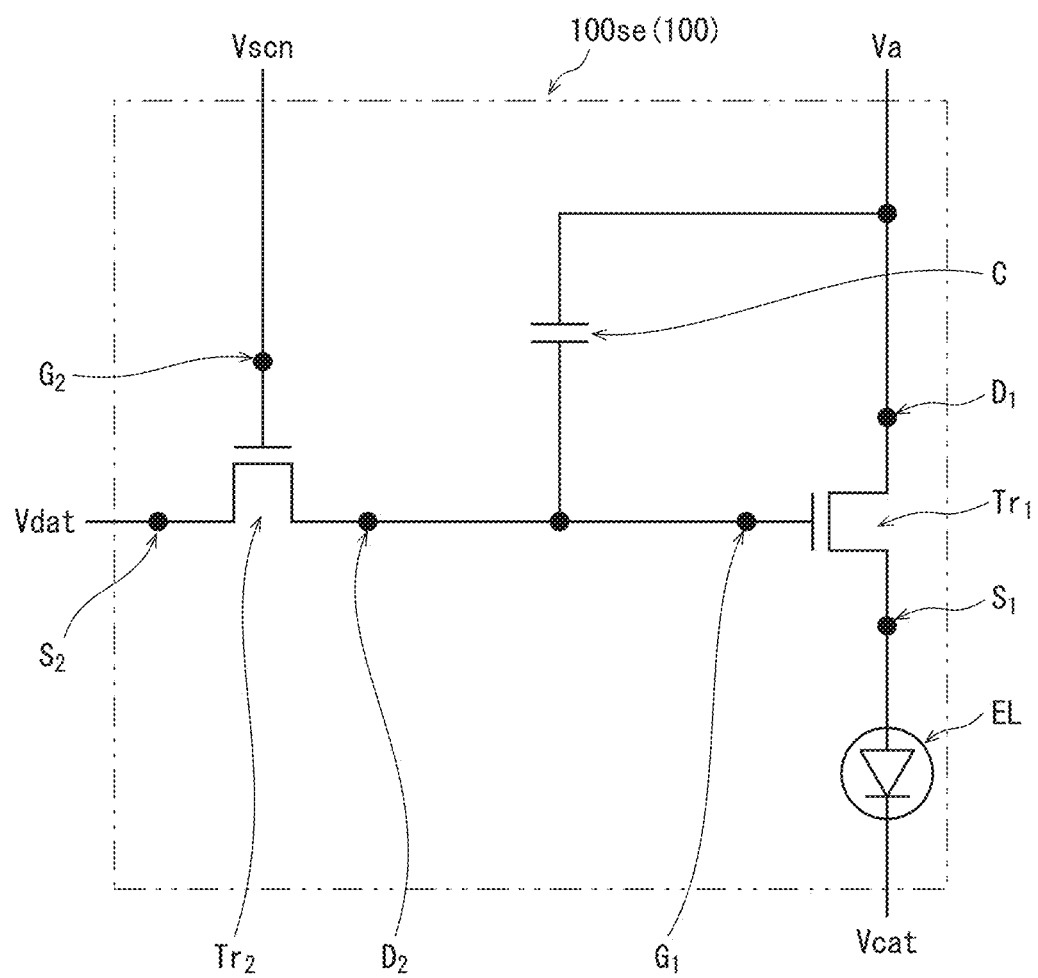
FIG. 2 is a schematic circuit diagram of circuit configuration of each subpixel 100se of an organic EL display panel 10 used in the organic EL display device 1.

FIG. 2 is a schematic circuit diagram showing the circuit configuration of an organic EL element 100 corresponding to the subpixels 100se of the display panel 10 used in the display device 1. The organic EL display elements 100 constituting the unit pixels 100e are arranged in a matrix as a display region of the display panel 10.

In the display panel 10 relating to the present embodiment, as shown in FIG. 2, each subpixel 100se includes two transistors $Tr_1$ and $Tr_2$, a single capacitance C, and an organic EL element unit EL as a light emitting unit. The transistor $Tr_1$ is a drive transistor, and the transistor $Tr_2$ is a switching transistor.

A gate $G_2$ and a source $S_2$ of the switching transistor $Tr_2$ are respectively connected to a scanning line Vscn and a data line Vdat. A drain $D_2$ of the switching transistor $Tr_2$ is connected to a gate $G_1$ of the drive transistor $Tr_1$.

A drain $D_1$ and a source $S_1$ of the drive transistor $Tr_1$ are respectively connected to a power line Va and a pixel electrode layer (anode) of the organic EL element unit EL. A counter electrode layer (cathode) of the organic EL element unit EL is connected to a ground line Vcat.

Note that the capacitance C is provided so as to connect between the drain $D_2$ of the switching transistor $Tr_2$ and the power line Va and connect between the gate $G_1$ of the drive transistor $Tr_1$ and the power line Va.

In the display panel 10, one unit pixel 100e is composed of a combination of adjacent subpixels 100se (for example, three subpixels 100se of R, G, and B luminescent colors), and a pixel region is composed of the subpixels 100se that are distributed. A gate line GL is extracted from the gate $G_2$ of each subpixel 100se, and is connected to the scanning line Vscn that is connected to the outside of the display panel 10. Similarly, a source line SL is extracted from the source $S_2$ of each subpixel 100se, and is connected to the data line Vdat that is connected to the outside of the display panel 10.

Furthermore, the power line Va and the ground line Vcat of each subpixel 100se are collectively connected to the power line Va and the ground line Vcat.

2. Overall Configuration of Organic EL Display Panel 10

The following describes the display panel 10 relating to the present embodiment with reference to the drawings. Note that the drawings are pattern diagrams and are not necessarily drawn to scale.

Figure 3:
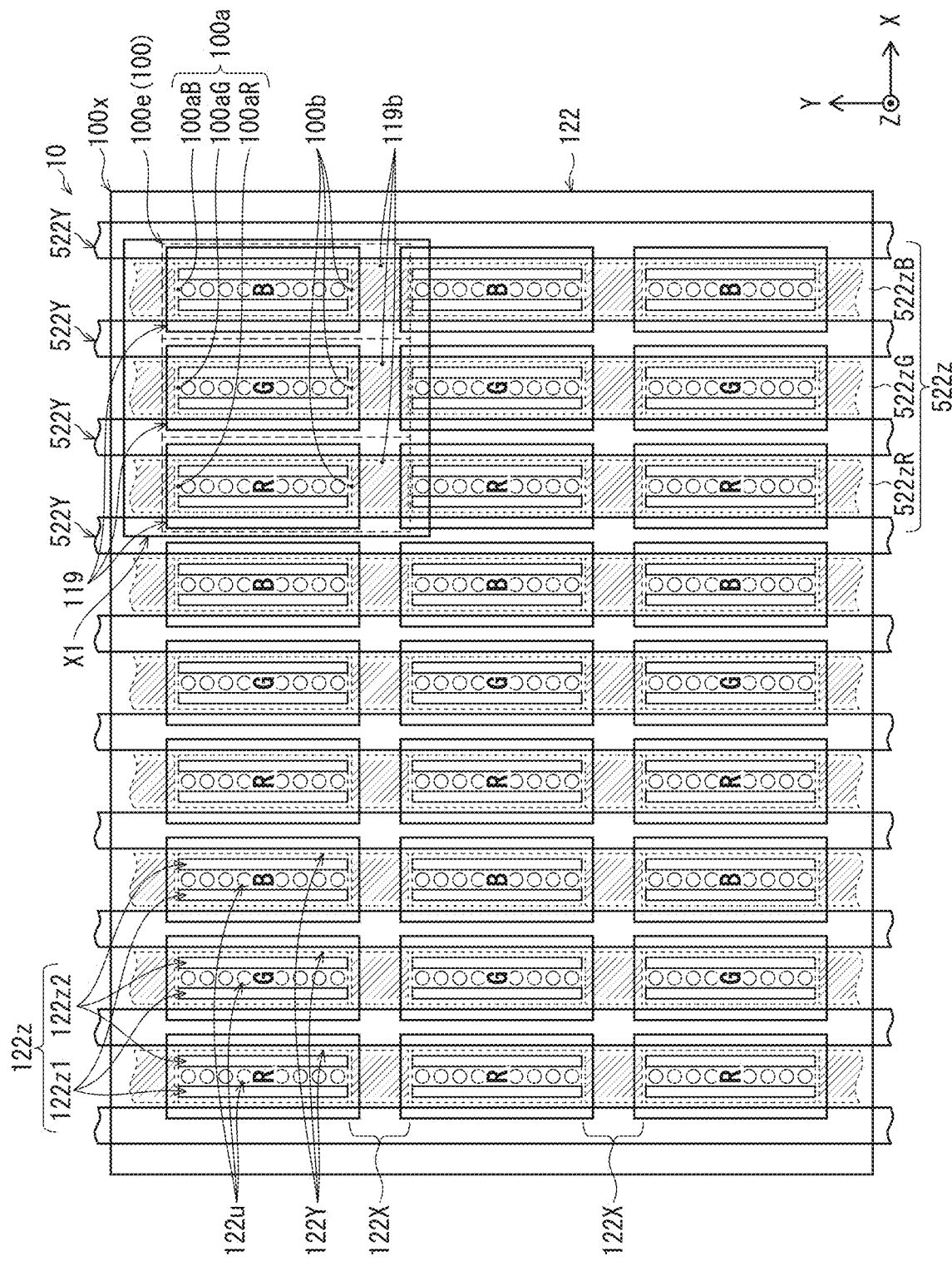
FIG. 3 is a schematic plan view of part of the organic EL display panel 10.

FIG. 3 is a schematic plan view showing part of the display panel 10 relating to the present embodiment. FIG.

Figure 5:
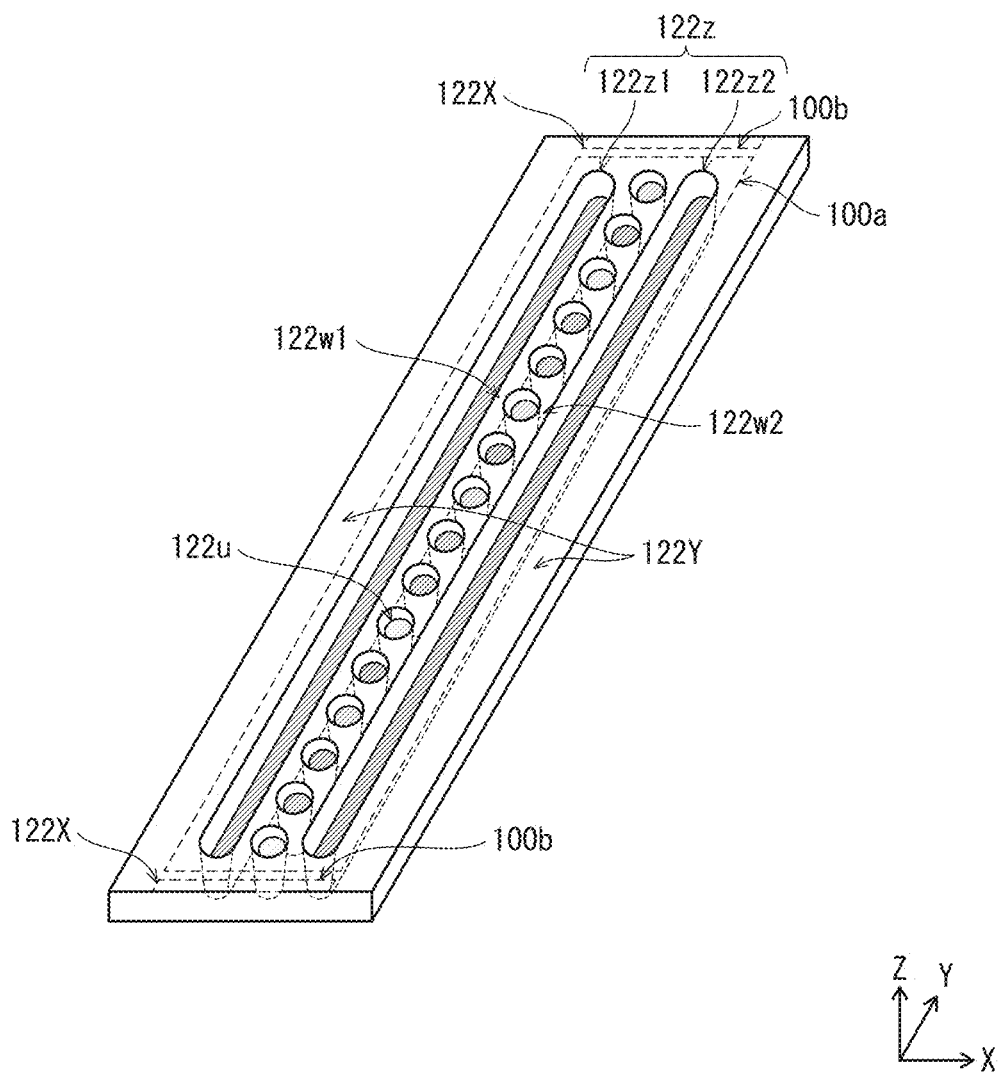
FIG. 5 is a perspective view from an oblique angle above a portion of the insulating layer 122 corresponding to a subpixel 100se of an organic EL element 100.

4A is an enlarged plan view of a portion X1 in FIG. 3 indicating one pixel 100 of the display panel 10. FIG. 4B is an enlarged plan view of the portion X1 viewed from above an insulating layer 122. FIG. 4C is a schematic cross-sectional view of an opening taken along a line B2-B2 in FIG. 4B. FIG. 5 is a perspective view from an oblique angle above a portion of the insulating layer 122 corresponding to the subpixel of the organic EL element 100.

The display panel 10 is an organic EL display panel that makes use of electroluminescence of organic compound. In the display panel 10, the organic EL elements 100 each constituting a pixel are arranged in a matrix on a substrate 100x (thin film transistor (TFT) substrate) on which TFTs are formed. The display panel 10 is of the top-emission type and emits light from an upper surface thereof. As shown in FIG. 3, the display panel 10 includes the organic EL elements 100, constituting the pixels, arranged in a matrix. Here, the X-direction, the Y-direction, and the Z-direction in FIG. 3 are respectively referred to as the row direction, the column direction, and the thickness direction in the display panel 10 in the present specification.

As shown in FIG. 3, the display panel 10 includes pixel electrode layers 119 that are arranged on the substrate 100x in a matrix, and includes an insulating layer 122 that covers the pixel electrode layers 119. In the case where the insulating layer 122 has an upper limit film thickness of 10 μm or more, variation in film thickness at the manufacturing further increases, and control on the bottom line thickness is difficult. The insulating layer 122 should preferably have an upper limit film thickness of 7 μm or less in terms of productivity decrease due to the increase in operation process. Also, the insulating layer 122 needs to have the film thickness and the bottom line thickness such that as the film thickness decreases, a difference therebetween decreases to substantially zero. For this reason, in the case where the insulating layer 122 has a lower limit film thickness of 1 μm or less, it is difficult to obtain a desired bottom line thickness due to resolution requirements. The insulating layer 122 used in exposure machines for typical flat display panels has a lower limit film thickness of 2 μm. In view of the above, the insulating layer 122 should preferably have a film thickness of 1 μm to 10 μm, and more preferably a film thickness of 2 μm to 7 μm, for example. In the present embodiment, the insulating layer 122 has a film thickness of approximate 5.0 μm.

The pixel electrode layers 119 are rectangular in plan view, and are made of a light-reflective material. The pixel electrode layers 119, which are arranged in a matrix, each correspond to any one of three subpixels 100aR, 100aG, and 100aB that are arranged in the row direction in the stated order (hereinafter referred to collectively as subpixels 100a when no distinction is made therebetween).

The insulating layer 122 is layered above the pixel electrode layers 119 which are arranged in a matrix. Above each of the pixel electrode layers 119, the insulating layer 122 has at least one elongated first opening, and specifically two elongated first openings 122z1 and 122z2 in the present embodiment, and further has second openings 122u. The first openings 122z1 and 122z2 are elongated in the column direction, and hereinafter referred to collectively as first openings 122z when no distinction is made therebetween. The second openings 122u are shorter in the longitudinal direction than the first openings 122z. The second openings 122u are lined up adjacent to the first openings 122z1 and 122z2. A range between the first opening 122z1 and the row of the second openings 122u constitutes a bar 122w1, and a range between the first opening 122z2 and the row of the second openings 122u constitutes a bar 122w2.

Also, as shown in FIG. 4C, the openings 122u functioning as the reflector each have a predetermined trapezoidal cross section taken along a plane perpendicular to the longitudinal direction whose width increases upward. This configuration improves the light extraction efficiency of light emitting layers 123. Effective shape and refractive index conditions of the reflector will be described later.

A rectangular region surrounded by outer edges of the openings 122z in the row direction and column direction constitutes a luminous region 100a where light is emitted by organic compound. Here, among gaps between the luminous regions 100a, gaps in the row direction between the luminous regions 100a arranged in the column direction are referred to as insulating sublayers 122X, and gaps in the column direction between the luminous regions 100a arranged in the row direction are referred to as insulating sublayers 122Y. Accordingly, outer edges of the luminous regions 100a in the row direction are defined by outer edges of the insulating sublayers 122X in the row direction, and outer edges of the luminous regions 100a in the column direction are defined by outer edges of the insulating sublayers 122Y in the column direction. Hereinafter, outer edges in the row direction and outer edges in the column direction are respectively referred to simply as row outer edges and column outer edges.

The insulating sublayers 122X extending in the row direction (the X-direction in FIG. 3) are each arranged in the column direction above the column outer edges of two pixel electrode layers 119 that are adjacent in the column direction and above a region adjacent to the column outer edges. A region where the insulating sublayer 122X is formed is a non-luminous region 100b. As shown in FIG. 3, the display panel 10 includes the luminous regions 100a and the non-luminous regions 100b that alternate in the column direction. In each of the non-luminous regions 100b, a connection concave part 119c (contact hole) connects the pixel electrode layer 119 and the source $S_1$ of the TFT via a connection electrode layer 117, and the pixel electrode layer 119 has a contact region 119b (contact window) for electrical connection.

The display panel 10 includes banks that are arranged in lines. Column banks 522Y extending in the column direction (the Y-direction in FIG. 3) are arranged in the row direction above the insulating sublayers 122Y, such that each of the column banks 522Y is arranged above the row outer edges of two pixel electrode layers 119 that are adjacent in the row direction and above a region adjacent to the row outer edges.

Each two adjacent column banks 522Y have a gap 522z therebetween, and accordingly the display panel 10 includes a large number of alternating column banks 522Y and gaps 522z.

The display panel 10 has three types of luminous regions 100a, namely luminous regions 100aR, 100aG, and 100aB that respectively emit red light, green light, and blue light (hereinafter referred to collectively as luminous regions 100a when no distinction is made therebetween). The gaps 522z include red gaps 522zR, green gaps 522zG, and blue gaps 522zB that respectively correspond to the luminous regions 100aR, 100aG, and 100aB (hereinafter referred to collectively as gaps 522z when no distinction is made therebetween). One set of the luminous regions 100aR, 100aG, and 100aB, which correspond to respective three subpixels 100se arranged in the row direction, constitutes a unit pixel 100e for color display.

Column light shielding sublayers 129Y are provided above the pixel electrode layers 119 so as to overlap row outer edges of the pixel electrode layers 119. Also, row light shielding sublayers 129X are provided above the pixel electrode layers 119 so as to overlap column outer edges of the pixel electrode layers 119 and so as not to partially overlap the contact regions 119b.

3. Configuration of Components of Display Panel 10

Figure 6:
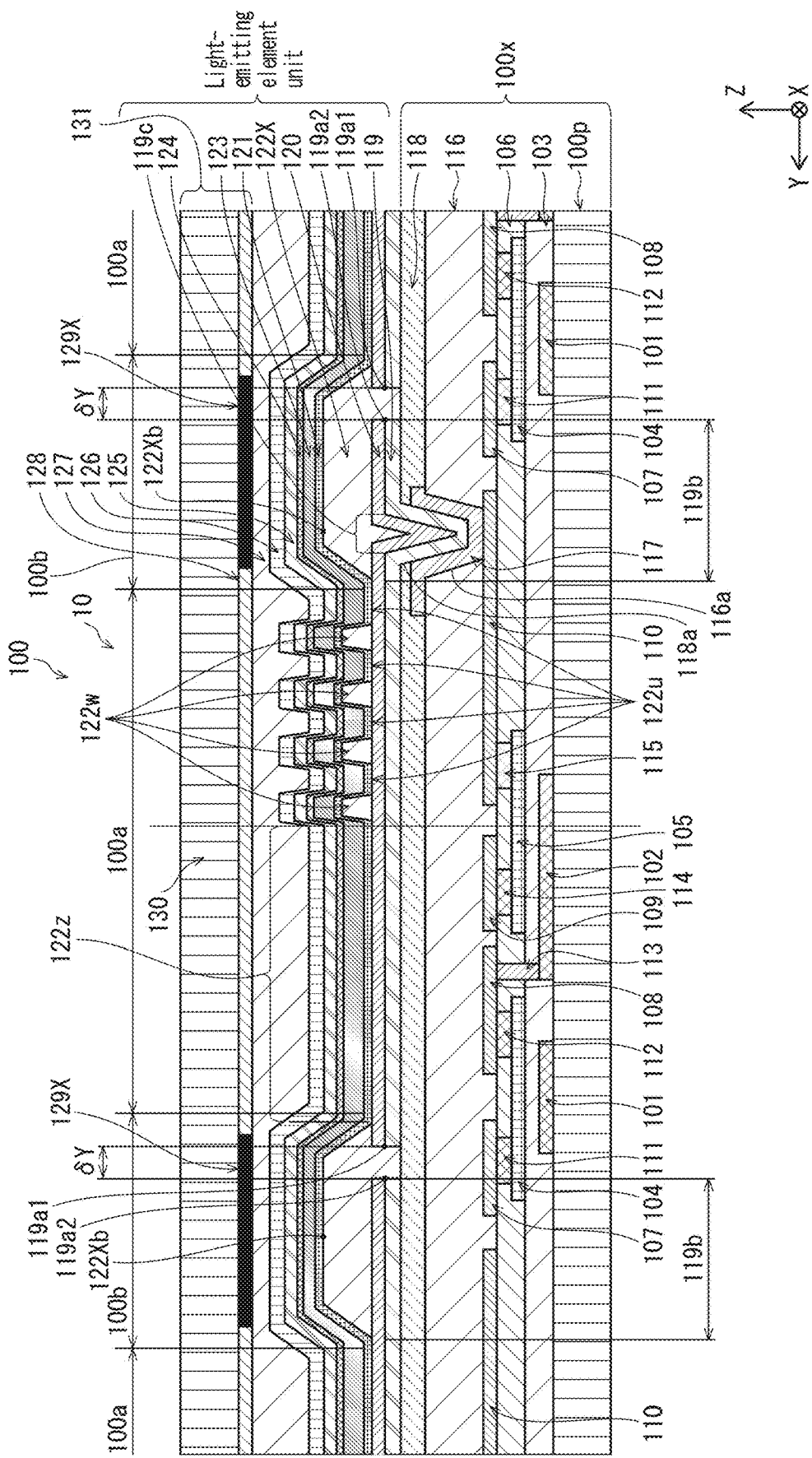
FIG. 6 is a schematic cross-sectional view taken along a line A1-A1 in FIG. 4B.
Figure 7:
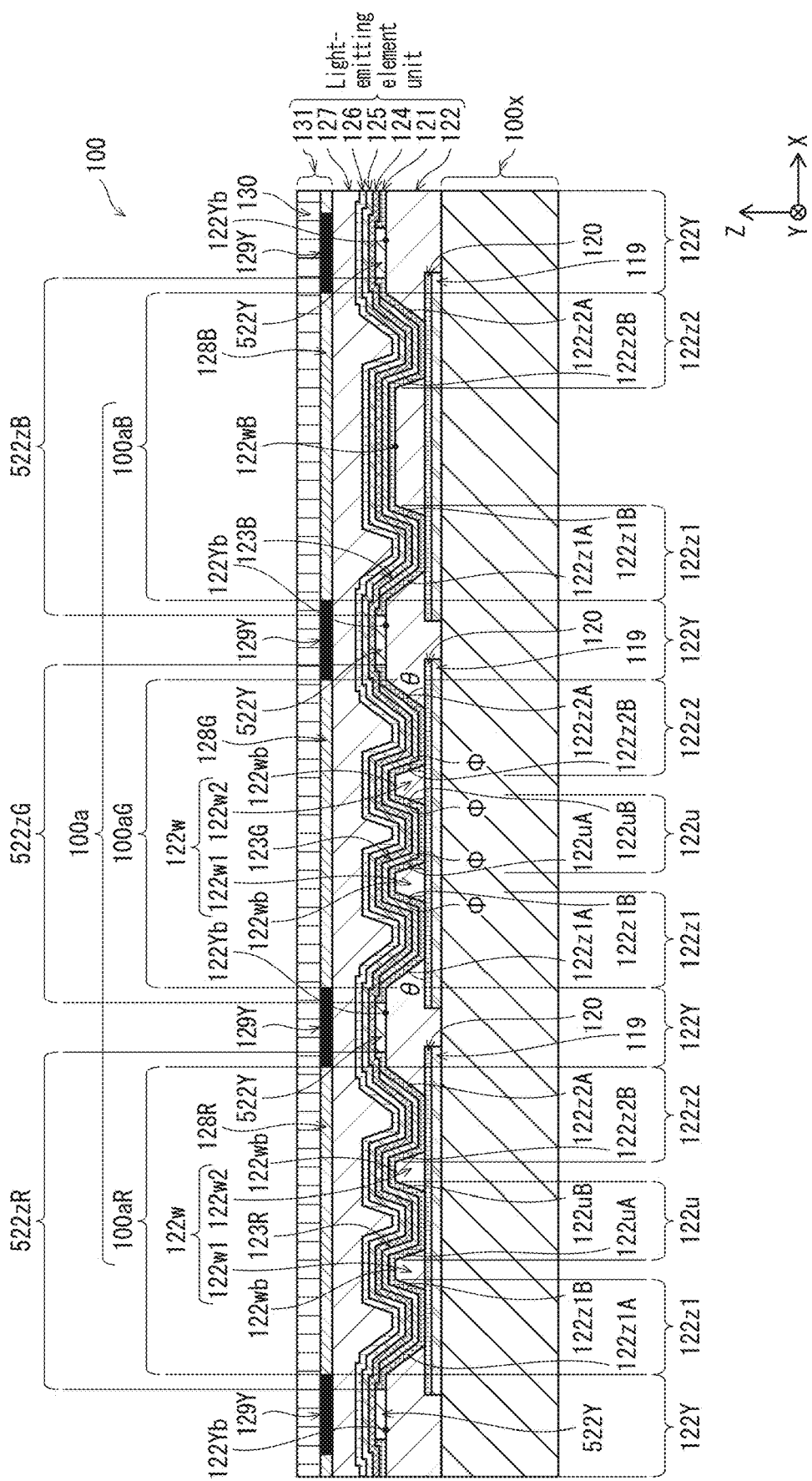
FIG. 7 is a schematic cross-sectional view taken along a line B1-B1 in FIG. 4B.

The following describes the configuration of the organic EL elements 100 of the display panel 10 with reference to schematic cross-sectional views in FIGS. 6 and 7. FIG. 6 is a schematic cross-sectional view taken along a line A-A in FIG. 4B. FIG. 7 is a schematic cross-sectional view taken along a line B1-B1 in FIG. 4B.

The display panel 10 relating to the present embodiment is of an organic EL display panel of the top-emission type, and includes the substrate 100x (TFT substrate) on which the TFTs are formed in a lower part in the Z-axis direction and the organic EL element units are formed thereon.

3.1 Substrate 100x (TFT Substrate)

As shown in FIG. 6, gate electrodes 101 and 102 are formed with an interval therebetween on a lower substrate 100p, and a gate insulating layer 103 is formed so as to cover respective surfaces of the gate electrodes 101 and 102 and the lower substrate 100p. Channel layers 104 and 105 are formed on the gate insulating layer 103 so as to respectively correspond to the gate electrodes 101 and 102. A channel protection layer 106 is formed so as to cover respective surfaces of the channel layers 104 and 105 and the gate insulating layer 103.

Source electrodes 107 and drain electrodes 108 are formed with an interval therebetween on the channel protection layer 106 so as to correspond to the gate electrodes 101 and the channel layers 104. Similarly, source electrodes 110 and drain electrodes 109 are formed with an interval therebetween on the channel protection layer 106 so as to correspond to the gate electrode 102 and the channel layer 105.

Source lower electrodes 111 and 115 are respectively formed below the source electrodes 107 and 110 by being inserted through the channel protection layer 106. Drain lower electrodes 112 and 114 are respectively formed below the drain electrodes 108 and 109 by being inserted through the channel protection layer 106. The source lower electrodes 111 and the drain lower electrodes 112 have low portions in the Z-axis direction that are in contact with the channel layer 104. The drain lower electrodes 114 and the source lower electrodes 115 have low portions in the Z-axis direction that are in contact with the channel layer 105.

Also, the drain electrodes 108 are connected with the gate electrodes 102 via contact plugs 113 that are provided by being inserted through the gate insulating layer 103 and the channel protection layer 106.

Note that the gate electrodes 101, the source electrodes 107, and the drain electrodes 108 respectively correspond to the gate $G_2$, the source $S_2$, and the drain $D_2$ in FIG. 2. Similarly, the gate electrodes 102, the source electrodes 110, and the drain electrodes 109 respectively correspond to the gate $G_1$, the source $S_1$, and the drain $D_1$ in FIG. 2. Accordingly, the switching transistor $Tr_2$ and the drive transistor $Tr_1$ are respectively formed leftward and rightward in the Y-axis direction in FIG. 6.

Note that the above configuration is just an example, and the arrangement of the transistors $Tr_1$ and $Tr_2$ is not limited to that in FIG. 6 and any configuration may be employed such as top-gate, bottom-gate, channel-etch, and etch-stop.

Passivation layers 116 are formed so as to cover the respective surfaces of the source electrodes 107 and 110, the drain electrodes 108 and 109, and the channel protection layer 106. The passivation layers 116 have contact holes 116a above part of upper portions of the source electrodes 110. The connection electrode layers 117 are layered so as to be along side walls of the contact holes 116a.

The connection electrode layers 117 have lower portions in the Z-axis direction that are connected with the source electrodes 110, and also have upper portions that are partially on the passivation layers 116. An interlayer insulating layer 118 is layered so as to cover respective surfaces of the connection electrode layers 117 and the passivation layers 116.

3.2 Organic EL Element Unit (1) Pixel Electrode Layers 119

The pixel electrode layers 119 are formed in units of subpixels on the interlayer insulating layer 118. The pixel electrode layers 119 are provided for supplying carries to the light emitting layers 123. When functioning as anodes for example, the pixel electrode layers 119 supply holes to the light emitting layers 123. Also, since the display panel 10 is of the top-emission type, the pixel electrode layers 119 are light-reflective. The pixel electrode layers 119 are rectangular and plate-like. The pixel electrode layers 119 are arranged on the substrate 100x with intervals 6X therebetween in the row direction and with intervals δY therebetween in the column direction in the gaps 522z. Furthermore, the pixel electrode layers 119 have the connection concave parts 119c that are connected with the connection electrode layers 117 through contact holes 118a that are provided above the connection electrode layers 117 in the inter insulating layer 118. Accordingly, the pixel electrode layers 119 are each connected with the source $S_1$ of the TFT via the connection electrode layer 117. The connection concave parts 119c of the electrode layers 119 are concave toward the substrate 100x.

The pixel electrode layers 119 have column outer edges 119a1 and 119a2, and the connection concave parts 119c are provided on the side of the column outer edges 119a2. The contact regions 119b are ranges from the column outer edges 119a2 to regions including the connection concave parts 119c.

(2) Hole Injection Layers 120

Hole injection layers 120 are layered on the pixel electrode layers 119 so as to be in contact with the pixel electrode layers 119. The hole injection layers 120 have a function of transporting holes, which are injected from the pixel electrode layers 119, to the light emitting layers 123.

(3) Insulating Layer 122

The insulating layer 122 is made of an insulating material, and is formed so as to cover at least end edges of the pixel electrode layers 119 which are arranged in a matrix.

Above each of the pixel electrode layers 119 except the contact regions 119b, the insulating layer 122 has the two first openings 122z1 and 122z2 and the plurality of second openings 122u. The first openings 122z1 and 122z2 are elongated in the column direction. The second openings 122u are shorter in longitudinal length than the first openings 122z, and are lined up adjacent to the first openings 122z1 and 122z2. As shown in FIGS. 6 and 7, the insulating layer 122 has the first openings 122z and the second openings 122u above the pixel electrode layers 119. The hole injection layers 120, which are layered on the pixel electrode layers 119, are exposed in these openings so as to be in contact with hole transport layers 121 which are described later. This configuration allows electrical charge supply in these openings from the pixel electrode layers 119 to the hole transport layers 121. Accordingly, the minimum rectangular region including the first openings 122z and the second openings 122u is the luminous region 100a where light is emitted by organic compound of any of the R, G, and B colors. Also, a gap of the insulating layer 122 between each two luminous regions 100a which are arranged in the column direction is the non-luminous region 100b. The insulating layer 122 has the bar 122w1, which is provided between each pair of the first opening 122z1 and the row of the second openings 122u, and has the bar 122w2, which is provided between each pair of the first opening 122z2 and the row of the second openings 122u.

Also, the insulating layer 122 includes the insulating sublayers 122Y, which are gaps between luminous regions 100a extending in the column direction and arranged in the row direction. Accordingly, the insulating sublayers 122Y define the row outer edges of the luminous regions 100a in the subpixels 100se. The insulating sublayers 122Y and the bars 122w1 and 122w2 each have a trapezoidal cross section taken along the row direction whose width decreases upward.

Here, upper edges 122wb of walls of the second openings 122u that are further from the row outer edges of the subpixels 100se are lower in height than upper edges 122Yb of walls of the first openings 122z that are nearest the row outer edges of the subpixels 100se. In other words, the upper edges 122wb of the bars 122w1 and 122w2 are lower in height than the upper edges 122Yb of the insulating sublayers 122Y. This configuration increases the flow of an ink, which contains organic compound as materials of the light emitting layers 123, in each subpixel during a manufacturing process. As a result, it is possible to suppress an insufficient spread of the ink containing the materials of the light emitting layers 123 in the subpixel, and suppress variation in application amount of the ink in the subpixel.

Furthermore, a gradient φ of the walls of the second openings 122u that are further from the row outer edges of the subpixels 100se is larger than a gradient θ of the walls of the first openings 122z that are nearest the row outer edges of the subpixels 100se. This configuration improves the light extraction efficiency in parts of the first openings 122z that are further from the row outer edges of the subpixels 100se, and also increases the viewing angle in parts of the first openings 122z that are nearest the row outer edges of the subpixels 100se, thereby to cause the light emitting layers 123 to efficiently emit light upward.

Also, the insulating layer 122 includes the insulating sublayers 122X (corresponding to the non-luminous regions 100b), which are gaps between luminous regions 100a extending in the row direction and arranged in the column direction. As shown in FIG. 4A, the insulating sublayers 122X are arranged above the contact regions 119b of the pixel electrode layers 119 and above the column outer edges 119a1 and 119a2 of the pixel electrode layers 119 which are adjacent to each other in the column direction. The insulating sublayers 122X cover the column outer edges 119a1 and 119a2 of the pixel electrode layers 119 thereby to prevent electric leakage between the pixel electrode layers 119 and the counter electrode layer 125, and thereby to define the column outer edges of the luminous regions 100a in the subpixels 100se.

Although not illustrated, the insulating sublayers 122X each have respective connection grooves that are communicated with the openings 122z1 and 122z2 provided above the substrate 100x. The connection grooves have upper openings and bottoms. The connection grooves may be communicated with the openings 122z1 and 122z2 provided in subpixels adjacent in the column direction. With this configuration, the connection grooves increase the flow of the ink, which contains organic compound as materials of the light emitting layers 123, in the column direction, thereby to suppress variation in application amount of the ink between the subpixels. Also, the hole injection layers 120 are not exposed in the connection grooves of the insulating layer, which have a groove-shape cross section and have upper openings and bottoms. Accordingly, the connection grooves do not contribute to light emission. The connection grooves have trapezoidal cross sections taken along a plane perpendicular to the longitudinal direction whose width increases upward.

The insulating sublayers 122X with an upper limit film thickness of greater than 2 μm deteriorate the ink spread. Meanwhile, the insulating sublayers 122X with an upper limit film thickness of 1.2 μm or smaller further improve the ink spread. Also, the insulating sublayers 122X with a lower limit film thickness of 0.1 μm or greater cover end parts of the pixel electrode layers 119 thereby to achieve manufacturing at a constant yield with no short between the pixel electrode layers 119 and a counter electrode layer 125. The insulating sublayers 122X with a lower limit film thickness of 0.2 μm or greater reduce the above short failure caused by variation in film thickness thereby to achieve stable manufacturing. In the case where the insulating sublayers 122X have the connection grooves, the same applies to the film thickness of the insulating sublayers 122X in the bottoms of the connection grooves.

Accordingly, the film thickness of the insulating sublayers 122X in the connection grooves and the film thickness of the insulating sublayers 122X in the bottoms of the connection grooves, if provided, each should preferably be 0.1 μm to 2 μm, and more preferably 0.2 μm to 1.2 μm, for example. In the present embodiment, these film thicknesses are each approximate 1.0 μm.

(4) Column Banks 522Y

The column banks 522Y, extending in the column direction, are arranged in the row direction above the insulating sublayers 122Y. The column banks 522Y define the row outer edges of the light emitting layers 123, which are formed by stemming the flow in the row direction of the ink containing organic compound as the material of the light emitting layers 123. The column banks 522Y are each provided above a pair of the row outer edges 119a3 and 119a4 of two adjacent pixel electrode layers 119 so as to partially overlap the pixel electrode layers 119. The column banks 522Y are linear and each have a trapezoidal cross section taken along the row direction whose width decreases upwards. The column banks 522Y are provided in the column direction so as to be perpendicular to the insulating sublayers 122X, and have upper surfaces that are higher in position than the upper surfaces 122xb of the insulating sublayers 122X.

(5) Hole Transport Layers 121

Hole transport layers 121 are layered on the insulating layer 122 and on the hole injection layers 120 in the openings 122z, and is in contact with the hole injection layers 120 in bottoms of the openings 122z. The hole transport layers 121 have a function of transporting holes, which are injected from the hole injection layers 120, to the light emitting layers 123.

(6) Light Emitting Layers 123

The display panel 10 includes a large number of alternating column banks 522Y and gaps 522z. The light emitting layers 123 extend in the column direction on the upper surfaces of the hole transport layers 121 in the gaps 522z which are defined by the column banks 522Y. The light emitting layer 123 emitting light of the R, G, and B colors are formed respectively in the red gaps 522zR, the green gaps 522zG, and the blue gaps 522zB, which respectively correspond to the luminous regions 100aR, 100aG, and 100aB.

The light emitting layers 123 are made of organic compound, and have a function of emitting light through recombination of holes and electrons thereinside. In the gaps 522z, the light emitting layers 123 are provided so as to be linear and extend in the column direction.

Light is emitted from only parts of the light emitting layers 123 to which carriers are supplied from the pixel electrode layers 119, and accordingly no electroluminescence of organic compound occurs in regions of the light emitting layers 123 where the insulating layer 122 is provided, which is made of an insulating material. Thus, light is emitted from only parts of the light emitting layers 123, positioned in the first openings 122z and the second openings 122u, where no insulating layer 122 is provided. These minimum rectangular regions including the first openings 122z and the second openings 122u are the luminous regions 100a.

In the light emitting layers 123, light is not emitted from parts that are located above the insulating sublayers 122X. These parts are the non-luminous regions 100b. In other words, the non-luminous regions 100b correspond to the insulating sublayers 122X that are projected in plan view.

(7) Electron Transport Layer 124

An electron transport layer 124 is formed on the column banks 522Y and on the light emitting layers 123 in the gaps 522z which are defined by the column banks 522Y. In this example, the electron transport layer 124 extends over parts of the column banks 522Y that are exposed from the light emitting layers 123. The electron transport layer 124 has a function of transporting electrons, which are injected from the counter electrode layer 125, to the light emitting layers 123.

(8) Counter Electrode Layer 125

The counter electrode layer 125 is formed so as to cover the electron transport layer 124. The counter electrode layer 125 is continuous over the entire display panel 10, and may be connected to a bus-bar wiring per pixel or per several pixels (not shown). The counter electrode layer 125 and the pixel electrode layers 119 in pairs sandwich the light emitting layers 123 therebetween to form an energizing path to supply carries to the light emitting layers 123. When functioning as a cathode for example, the counter electrode layer 125 supplies electrons to the light emitting layers 123. The counter electrode layer 125 is formed so as to be along a surface of the electron transport layer 124, and is a common electrode for the light emitting layers 123.

Since the display panel 10 is of the top-emission type, the counter electrode layer 125 is made of a light-transmissive and conductive material. The counter electrode layer 125 is made for example of indium tin oxide (ITO) or indium zinc oxide (IZO). Alternatively, the counter electrode layer 125 may be a thin electrode film made of silver (Ag), aluminum (Al), or the like.

(9) Sealing Layer 126

A sealing layer 126 is formed so as to cover the counter electrode layer 125. The sealing layer 126 is provided in order to suppress degradation of the light emitting layers 123 due to exposure to moisture, air, and so on. The sealing layer 126 is provided for the entire display panel 10 so as to cover an upper surface of the counter electrode layer 125. Since the display panel 10 is of the top-emission type, the sealing layer 126 is made of a light-transmissive material such as silicon nitride and silicon oxynitride.

(10) Bond Layer 127

A bond layer 127 bonds the sealing layer 126 and a CF substrate 131 that is provided above the sealing layer 126 in the Z-axis direction. The CF substrate 131 includes an upper substrate 130 that has a lower main surface in the Z-axis direction on which color filter layers 128 and a light shielding layer 129 are formed. The bond layer 127 bonds a rear panel that is composed of the substrate 100X and the layers ranging from the pixel electrode layers 119 to the sealing layer 126, to the CF substrate 131. The bond layer 127 also has a function of preventing the layers from being exposed to moisture, air, and so on.

(11) Upper Substrate 130

The CF substrate 131, which includes the upper substrate 130 on which the color filter layers 128 and the light shielding layer 129 are formed, is bonded onto the bond layer 127. Since the display panel 10 is of the top-emission type, the upper substrate 130 is made of a light-transmissive material such as a cover glass and a transparent resin film. Also, providing the upper substrate 130 for example improves the rigidity of the display panel 10, and prevents moisture, air, and so on from intruding the display panel 10.

(12) Color Filter Layers 128

The color filter layers 128 are formed on the upper substrate 130 so as to correspond in position and color to the luminous regions 100a. The color filter layers 128 are transparent layers that are provided for transmitting visible light of wavelength corresponding to the R, G, and B colors, and have a function of transmitting light emitted from the R, G, and B pixels and correcting chromaticity of the light. In this example, the red color filter layers 128R, the green color filter layers 128G, and the blue color filter layers 128B are respectively formed above the luminous regions 100aR in the red gaps 522zR, the luminous regions 100aG in the green gaps 522zG, and the luminous regions 100aB in the blue gaps 522zB.

(13) Light Shielding Layer 129

The light shielding layer 129 is formed on the upper substrate 130 so as to correspond in position to boundaries between the luminous regions 100a in the pixels.

The light shielding layer 129 is a black resin layer that is provided in order to prevent transmission of visible light of wavelength corresponding to the R, G, and B colors. The light shielding layer 129 is made for example of a resin material including black pigment having excellent light absorbing property and light shielding property. The light shielding layer 129 includes the column light shielding sublayers 129Y, which extend in the column direction and are arranged in the row direction, and the row light shielding sublayers 129X, which extend in the row direction and are arranged in the column direction. A lattice shape is formed by the column light shielding sublayers 129Y and the row light shielding sublayers 129X. In the organic EL elements 100, the column light shielding sublayers 129Y are arranged so as to overlap the insulating sublayers 122Y as shown in FIG. 7, and the row light shielding sublayers 129X are arranged so as to overlap the insulating sublayers 122X as shown in FIG. 6.

3.3 Materials of Components

The following describes an example of materials of the components.

(1) Substrate 100x (TFT Substrate)

The substrate 100x is made of a known material for TFT substrate.

The lower substrate 100p is for example a glass substrate, a quartz substrate, a silicon substrate, a metal substrate made of molybdenum sulfide, copper, zinc, aluminum, stainless, magnesium, iron, nickel, gold, or silver, a semiconductor substrate made of gallium arsenide base or the like, or a plastic substrate.

Either thermoplastic resin or thermosetting resin may be used as a plastic material. The plastic material may be for example a single layer of any one type of the following materials or a laminate of any two or more types of the following materials including polyethylene, polypropylene, polyamide, polyimide (PI), polycarbonate, acrylic resin, polyethylene terephthalate (PET), polybutylene terephthalate, polyacetal, other fluororesin, thermoplastic elastomer such as styrene elastomer, polyolefin elastomer, polyvinyl chloride elastomer, polyurethane elastomer, fluorine rubber elastomer, and chlorinated polyethylene elastomer, epoxy resin, unsaturated polyester resin, silicone resin, polyurethane, or copolymer, blend, polymer alloy or the like mainly including such a material.

The gate electrodes 101 and 102 are made for example of a laminate of copper (Cu) and molybdenum (Mo). Alternatively, other metal material is adoptable.

The gate insulating layer 103 is made for example of any known electrically-insulating material such as silicon dioxide ($SiO_2$) and silicon nitride (SiNx), regardless of whether the material is organic or inorganic.

The channel layers 104 and 105 are made of oxide semiconductor including at least one of indium (In), gallium (Ga), and zinc (Zn).

The channel protection layer 106 is made for example of silicon oxynitride (SiON), silicon nitride (SiN), or aluminum oxide (AlOx).

The source electrodes 107 and 110 and the drain electrodes 108 and 109 are made for example of a laminate of copper-manganese (CuMn), copper (Cu), and molybdenum (Mo).

The similar material is adoptable for the source lower electrodes 111 and 115 and the drain lower electrodes 112 and 114.

The passivation layers 116 are made for example of silicon dioxide ($SiO_2$), a combination of silicon nitride (SiN) and silicon oxynitride (SiON), or a combination of silicon oxide (SiO) and silicon oxynitride (SiON).

The connection electrode layers 117 are made for example of a laminate of copper-manganese (CuMn), copper (Cu), and molybdenum (Mo). Alternatively, the material of the connection electrode layers 117 may be appropriately selected from conductive materials.

The interlayer insulating layer 118 is made for example of an organic compound such as polyimide, polyamide, and acrylic resin, and has a film thickness of 2000 nm to 8000 nm for example.

(2) Pixel Electrode Layers 119

The pixel electrode layers 119 are made of a metal material. The display panel 10 relating to the present embodiment, which is of the top-emission type, should preferably have a surface part that is highly light-reflective. In the display panel 10 relating to the present embodiment, the pixel electrode layers 119 each may be a laminate including layers selected from a metal layer, an alloy layer, and a transparent conductive layer. The metal layer is made for example of a metal material including silver (Ag) or aluminum (Al). The alloy layer is made for example of alloy of silver, palladium, and copper (APC), alloy of silver, rubidium, and gold (ARA), alloy of molybdenum and chromium (MoCr), or alloy of nickel and chromium (NiCr). The transparent conductive layer is made for example of indium tin oxide (ITO) or indium zinc oxide (IZO).

(3) Insulating Layer 122

The insulating layer 122 is made of an insulating material. The organic material of the insulating layer 122 is for example an organic photosensitive resin material such as acrylic resin, polyimide resin, and novolac phenolic resin. Acrylic resin should preferably be used because of having a low refractive index and thus being desirable as a reflector. Alternatively, in the case where the insulating layer 122 is made of an inorganic material, silicon oxide (SiO) for example should preferably be used in terms of refractive index. The inorganic material may be for example silicon nitride (SiN) or silicon oxynitride (SiON). The insulating layer 122 has a film thickness of approximate 5 μm. The film thickness of the insulating layer 122 is not limited to this, and alternatively may fall within a range of for example 0.1 μm to 10 μm.

(4) Column Banks 522Y

The column banks 522Y are made of an insulating organic material such as resin. Examples of the organic material of the column banks 522Y include acrylic resin, polyimide resin, and novolac phenolic resin. The column banks 522Y should preferably have an organic solvent resistance. Also, the column banks 522Y sometimes undergo an etching process, a baking process, and so on during the manufacturing process, and accordingly should preferably be made of a highly resistant material in order to avoid excessive distortion, transformation, and the like due to such processes. Also, fluorine processing may be performed on surfaces of the column banks 522Y in order to provide the surfaces with water repellency. Alternatively, the column banks 522Y may be made of a material containing fluorine.

(5) Hole Injection Layers 120

The hole injection layers 120 are made for example of oxide of a metal such as silver (Ag), molybdenum (Mo), chromium (Cr), vanadium (V), tungsten (W), nickel (Ni), and iridium (Ir), or a conductive polymer material such as polyethylenedioxythiophene (PEDOT).

In the case where the hole injection layers 120 are made of oxide of transition metal, the hole injection layers 120 have energy levels because oxide of transition metal has oxidation numbers. This facilitates hole injection, and thus reduces driving voltage.

(6) Hole Transport Layers 121

The hole transport layers 121 are made for example of a high-molecular compound such as polyfluorene, polyfluorene derivative, polyallylamine, and polyallylamine derivative.

(7) Light Emitting Layers 123

The light emitting layers 123 have a function of emitting light by excitation resulting from injection and recombination of holes and electrons, as described above. The light emitting layers 123 need to be made of a luminous organic material by a wet printing method.

Specifically, the light emitting layers 123 should preferably be made for example of a fluorescent substance disclosed in Japanese Patent Application Publication No. H05-163488, such as oxinoid compound, perylene compound, coumarin compound, azacoumarin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylenepyran compound, dicyanomethylenethiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, and metal complex of 8-hydroxyquinoline compound, metal complex of 2-bipyridine compound, complex of a Schiff base and group III metal, oxine metal complex, and rare earth complex.

(8) Electron Transport Layer 124

The electron transport layer 124 is made for example of oxydiazole derivative (OXD), triazole derivative (TAZ), or phenanthroline derivative (BCP Bphen).

(9) Counter Electrode Layer 125

The counter electrode layer 125 is made for example of indium tin oxide (ITO) or indium zinc oxide (IZO). Alternatively, the counter electrode layer 125 may be a thin electrode film made of silver (Ag), aluminum (Al), or the like.

(10) Sealing Layer 126

The sealing layer 126 has a function of preventing the organic layers such as the light emitting layers 123 from being exposed to moisture, air, and so on. The sealing layer 126 is made for example of a light-transmissive material such as silicon nitride (SiN) and silicon oxynitride (SiON). Also, a resin sealing layer that is made of a resin material such as acrylic resin and silicone resin may be provided on a layer that is made of a material such as silicon nitride (SiN) and silicon oxynitride (SiON).

Since the display panel 10 relating to the present embodiment is of the top-emission type, the sealing layer 126 needs to be made of a light-transmissive material.

(11) Bond Layer 127

The bond layer 127 is made for example of a resin adhesive. A light-transmissive resin material is adoptable such as acrylic resin, silicone resin, and epoxy resin.

(12) Upper Substrate 130

The upper substrate 130 is made for example of a light-transmissive material such as glass, quartz, and plastic.

(13) Color Filter Layers 128

The color filter layers 128 are made of a known resin material (for example, the color resist manufactured by JSR Corporation) or the like.

(14) Light Shielding Layer 129

The light shielding layer 129 is made mainly of an ultraviolet curable resin, such as an ultraviolet curable acrylic resin, to which black pigment is added. The black pigment is for example carbon black pigment, titanium black pigment, metal oxide pigment, or organic pigment.

3.4 Improvement of Light Extraction Efficiency by Reflector

The display panel 10 includes: the reflector (reflective structure) that is constituted from the insulating layer 122, which has the first openings 122z and the second openings 122u, and the bond layer 127, which has a rear surface that is convex along the first openings 122z and the second openings 122u of the insulating layer 122; and the light emitting layers 123, which are provided between the insulating layer 122 and the bond layer 127. The first openings 122z and the second openings 122u each have a profile of a trapezoidal cross section taken along the row direction whose width increases upward. When the refractive indices of the bond layer 127 and the insulating layer 122 are represented by $n_1$ and $n_2$, respectively, the following relationships are satisfied.

$$1.1 \leq n_1 \leq 1.8 \quad \text{(Formula 1)}$$

$$|n_1 - n_2| \geq 0.20 \quad \text{(Formula 2)}$$

Here, the refractive index $n_2$ should preferably be 1.4 to 1.6.

Also, when a depth, an upper width, and a lower width in the cross section of the first openings 122z and the second openings 122u are represented by $D$, $W_h$, and $W_1$, respectively, the following relationships should preferably be satisfied.

$$0.5 \leq W_1/W_h \leq 0.8 \quad \text{(Formula 3)}$$

$$0.5 \leq D/W_1 \leq 2.0 \quad \text{(Formula 4)}$$

With the above shape and refractive index conditions, it is possible to improve the light extraction efficiency of the light emitting layers 123 owing to the first openings 122z and the second openings 122u of the insulating layer 122, which function as the reflector. According to the inventors' consideration, this results in increase of luminance per subpixel by 1.2 times to 1.5 times of that in display panels with no reflector.

4. Manufacturing Method of Display Panel 10

The following describes a manufacturing method of the display panel 10 with reference to the drawings. FIGS. 8A to 8E, FIGS. 9A to 9C, and FIGS. 10A to 10C are schematic cross-sectional views showing the processes of manufacturing the display panel 10, taken along a line at the same position as the line A1-A1 in FIG. 4B. FIGS. 12A to 12D and FIGS. 13A to 13D are schematic cross-sectional views showing the processes of manufacturing the display panel 10, taken along a line at the same position as the line B1-B1 in FIG. 4B.

(1) Formation of Substrate 100x (TFT Substrate)

Figure 8A:
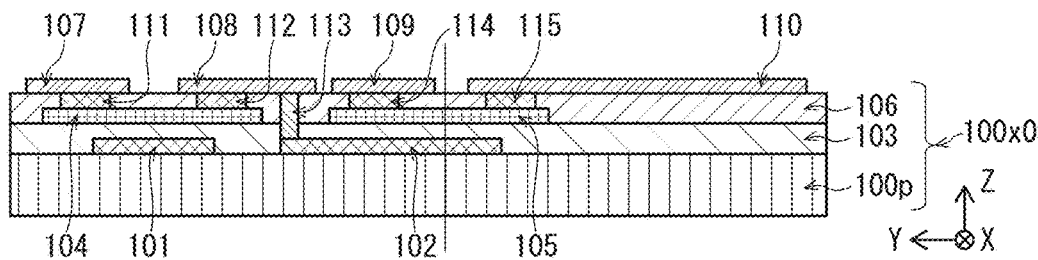
FIGS. 8A to 8E are schematic cross-sectional views of the organic EL display panel 10 during manufacture, taken along a line at the same position as the line A1-A1 in FIG. 4B.

First, a substrate 100x0 is prepared. The substrate 100x0 has formed thereon components from drain electrodes 101 and 102 to source electrodes 107 and 110 and drain electrodes 108 and 109. The substrate 100x0 is manufactured by a known TFT manufacturing method (FIG. 8A).

Figure 8B:
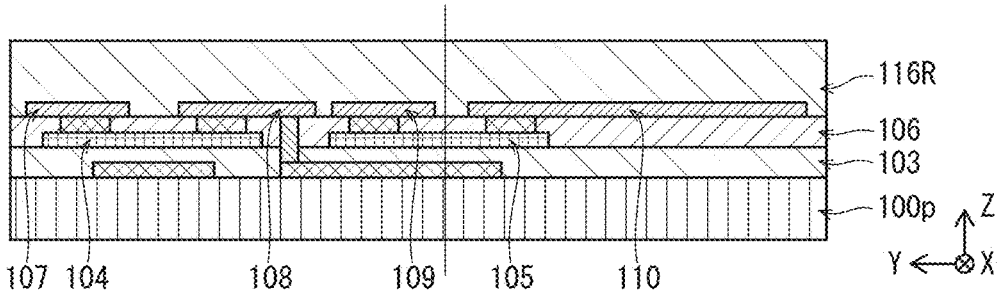

Next, passivation layers 116 are formed for example with a plasma CVD method or a sputtering method so as to cover the source electrodes 107 and 110, the drain electrodes 108 and 109, and a channel protection layer 106 (FIG. 8B).

Figure 8C:
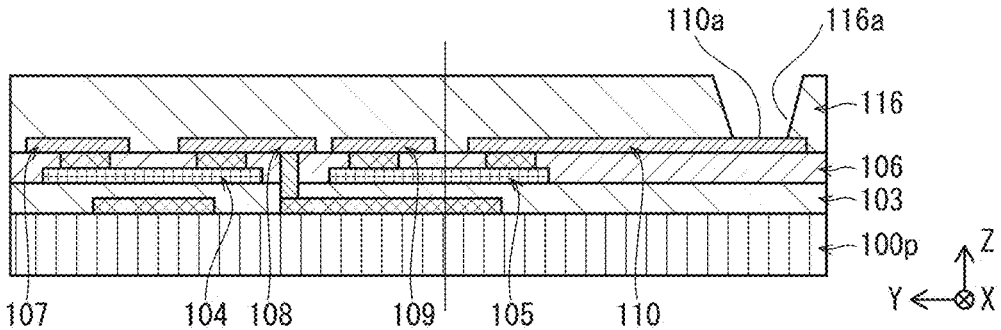

Next, a contact hole 116a is provided in each of the source electrodes 110 in the passivation layers 116 with a dry etching method (FIG. 8C). The contact hole 116a is provided so as to have a bottom in which a surface of the source electrode 110 is exposed.

Figure 8D:
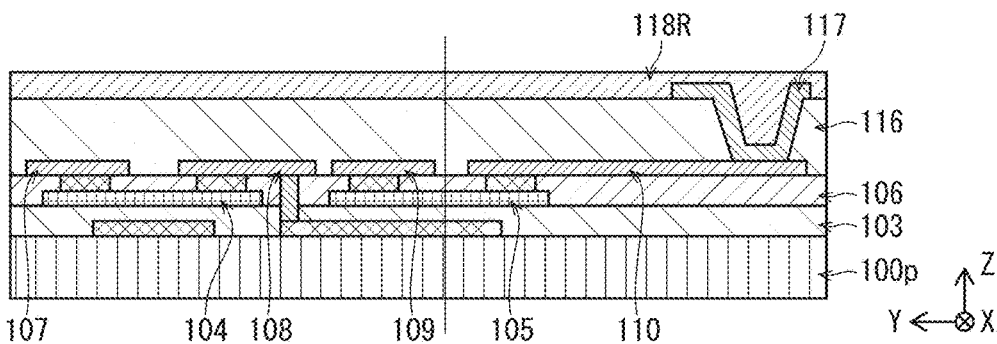

Next, connection electrode layers 117 are formed so as to be along inner walls of the contact holes 116a provided in the passivation layers 116. The connection electrode layers 117 have upper portions that are partially on the passivation layers 116. The connection electrode layers 117 are formed by forming a metal film with for example the sputtering method, and then patterning the metal film with a photolithography method and a wet etching method. Furthermore, an interlayer insulating layer 118 is formed by applying an organic material onto the connection electrode layers 117 and the passivation layers 116 so as to cover these layers and planarizing a surface of the applied organic material (FIG. 8D).

(2) Formation of Pixel Electrode Layers 119

Figure 8E:
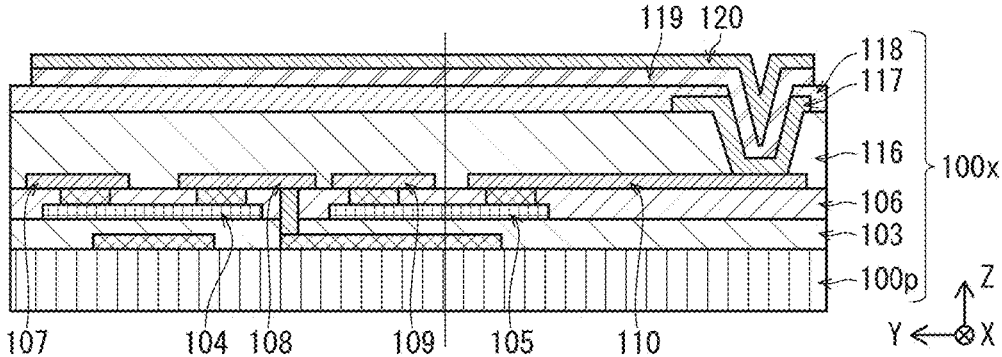

Contact holes are provided above the connection electrode layers 117 in the interlayer insulating layer 118. Then, pixel electrode layers 119 and hole injection layers 120 are formed in the stated order in the contact holes (FIG. 8E). The pixel electrode layers 119 and the hole injection layers 120 are respectively formed by forming a metal film and a metal oxide film with the sputtering method, a vacuum deposition method, or the like, and then patterning the metal film and the metal oxide film with the photolithography method. Note that the pixel electrode layers 119 are electrically connected with the connection electrode layers 117.

(3) Formation of Insulating Layer 122

Figure 9A:
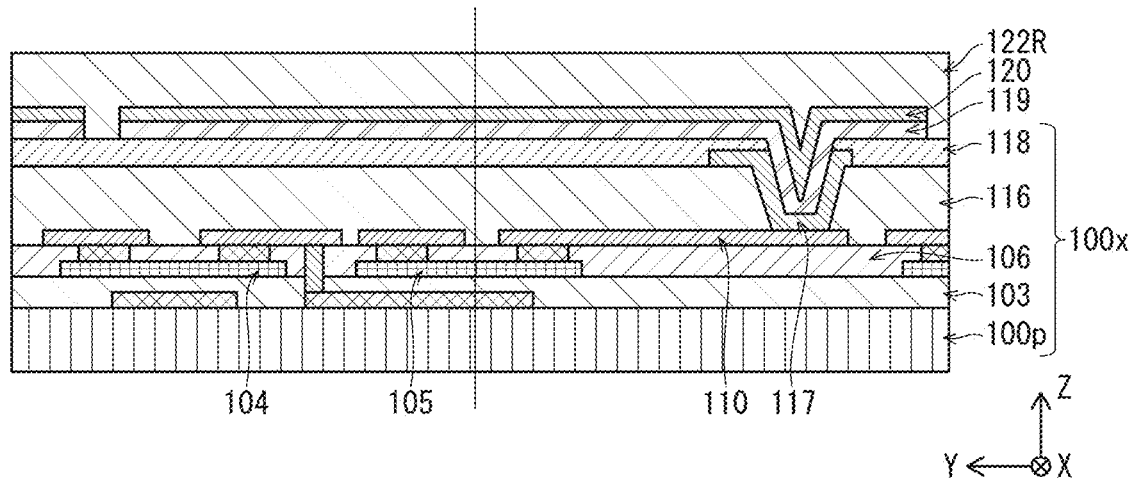
FIGS. 9A to 9C are schematic cross-sectional views of the organic EL display panel 10 during manufacture, taken along a line at the same position as the line A1-A1 in FIG. 4B.
Figure 9B:
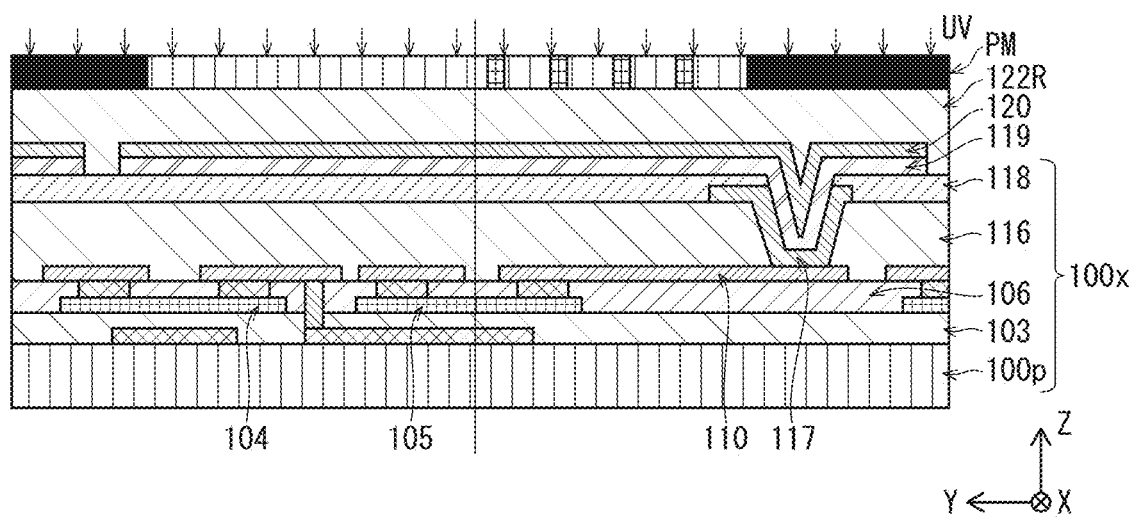
Figure 12A:
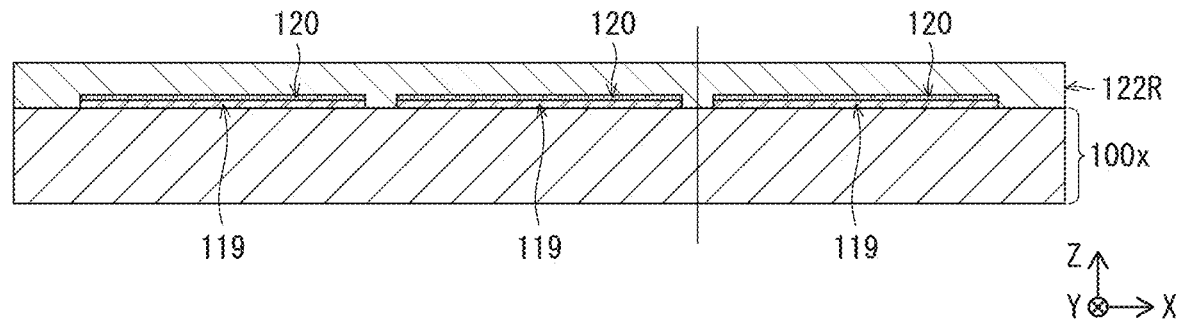
FIGS. 12A to 12D are schematic cross-sectional views of the organic EL display panel 10 during manufacture, taken along a line at the same position as the line B1-B1 in FIG. 4B.
Figure 12B:
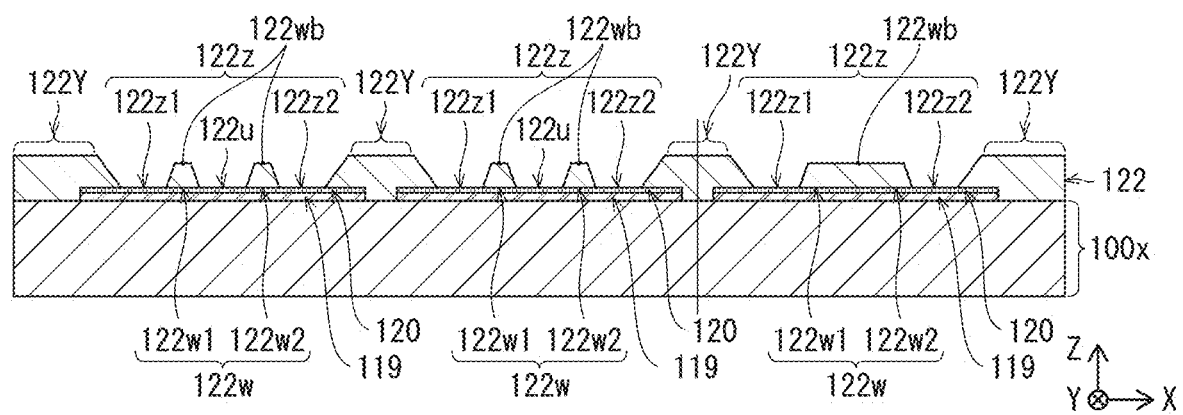

In a formation process of an insulating layer 122, a reflector is complete through application of an organic material onto the substrate, exposure, development, and firing (for approximate 60 minutes at approximate 230° C.). In the exposure, a photomask PM is used as a halftone mask, which varies transmissivity so as correspond to an exposure amount suitable for each film thickness. Specific description is given below. First, a photosensitive resin film 122R is formed using an organic photosensitive resin material such as acrylic resin, polyimide resin, and novolac phenolic resin (FIGS. 9A and 12A). Then, the photosensitive resin film 122R is dried and a solvent thereof is vaporized to a certain degree. Then, a photomask PM having predetermined openings is overlaid above the photosensitive resin film 122R. Ultraviolet irradiation is performed on the photomask PM thereby to expose a photoresist made of photosensitive resin or the like to transfer patterns of the photomask PM to the photoresist (FIGS. 9B and 12B). In the present embodiment, the photomask PM is for example a halftone mask for positive photoresists that includes transmissive parts (vertical stripe portions in the figures) corresponding to openings 122z and semi-transmissive parts (lattice portions in the figures) corresponding to bars 122w1 and 122w2. The transmissive parts are parts through which light transmits. The semi-transmissive parts are intermediate between the transmissive parts and light shielding parts in terms of transmissivity. As a result of the exposure, the photoresist has opening patterns corresponding in shape to the transmissive parts, which correspond to the openings 122z, and has groove patterns having an intermediate exposure amount and corresponding in shape to the semi-transmissive parts, which correspond to the bars 122w1 and 122w2. With use of the halftone mask, it is possible to form patterns having different exposure amounts in a photoresist by a single exposure.

Figure 9C:
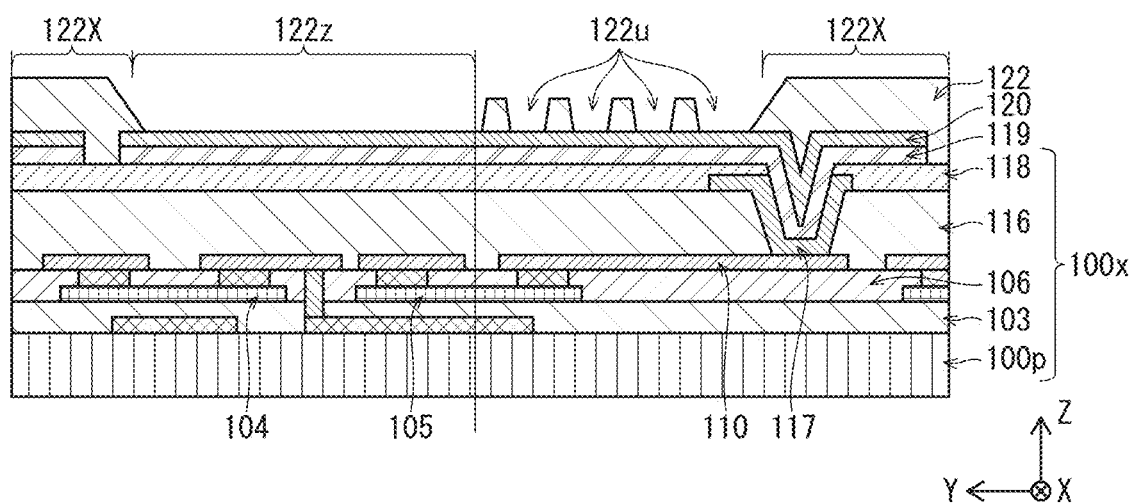

Next, development is performed on the photoresist on which patterns of insulating sublayers 122X and 122Y, first openings 122z, and second openings 122u are formed. As a result, an insulating layer 122 is complete (FIGS. 9C and 12B). Parts of the photoresist, which have the opening patterns with the highest exposure amount, are developed and removed, and thus result in no insulating layer 122. Parts of the photoresist, which have the grooves patterns with the intermediate exposure amount, are developed, and thus result in the insulating layer 122 having a film thickness of approximate 3 μm. Pattern parts of the photoresist, which are not exposed, result in the insulating layer 122 having a film thickness of approximate 5 μm.

At this time, the first opening 122z and the second openings 122u each have a trapezoidal cross section taken along a plane perpendicular to the longitudinal direction whose width increases upward, as described above. This allows to form the insulating layer 122 including the insulating sublayers 122X and 122Y of a thickness of approximate 5 μm that surround regions defining pixels. Also, the patterning is performed such that surfaces of the hole injection layers 120 are exposed in the bottoms of the first openings 122z1 and 122z2 and the second openings 122u and such that parts of the insulating layer 122, which correspond to upper edges 122wb of the bars 122w1 and 122w2, have a film thickness of approximate 3 μm.

The insulating layer 122 may be manufactured so as to have the parts with a thickness of approximate 3 μm corresponding to the upper edges 122wb of the bars 122w1 and 122w2 by using a general mask pattern for the parts corresponding to the bars 122w1 and 122w2 instead of the halftone mask, and performing exposure for an increased period and development.

(4) Formation of Column Banks 522Y

Figure 12C:
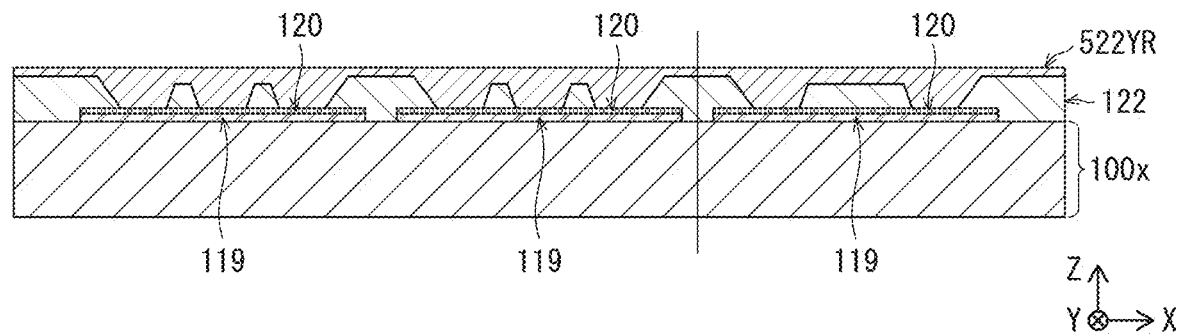
Figure 12D:
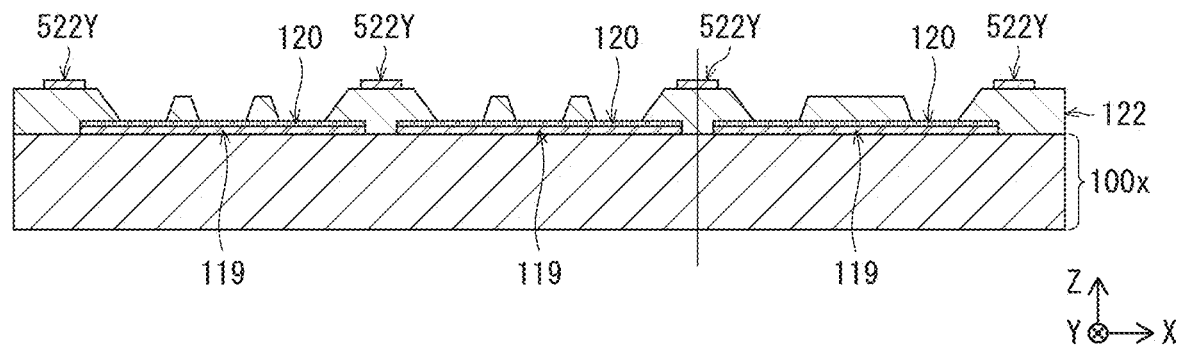

Column banks 522Y are formed as follows. First, a film 522YR made of a material of the column banks 522Y such as a photosensitive resin material is formed on the insulating layer 122 with a spin coat method or the like (FIG. 12C). Then, the film 522YR is patterned to such that gaps 522z are provided. As a result, the column banks 522Y are formed (FIG. 12D). The gaps 522z are provided by performing exposure through a mask overlaid above the film 522YR and then performing development. The column banks 522Y, extending in the column direction along upper surfaces of the insulating sublayers 122Y, are arranged with the gaps 522z therebetween in the row direction.

(5) Formation of Hole Transport Layers 121

Figure 10A:
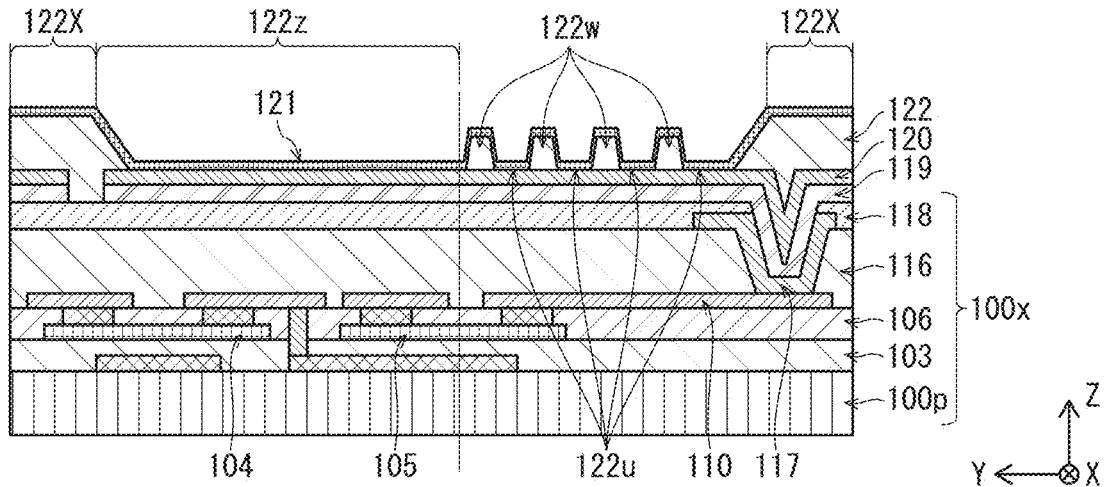
FIGS. 10A to 10C are schematic cross-sectional views of the organic EL display panel 10 during manufacture, taken along a line at the same position as the line A1-A1 in FIG. 4B.
Figure 13A:
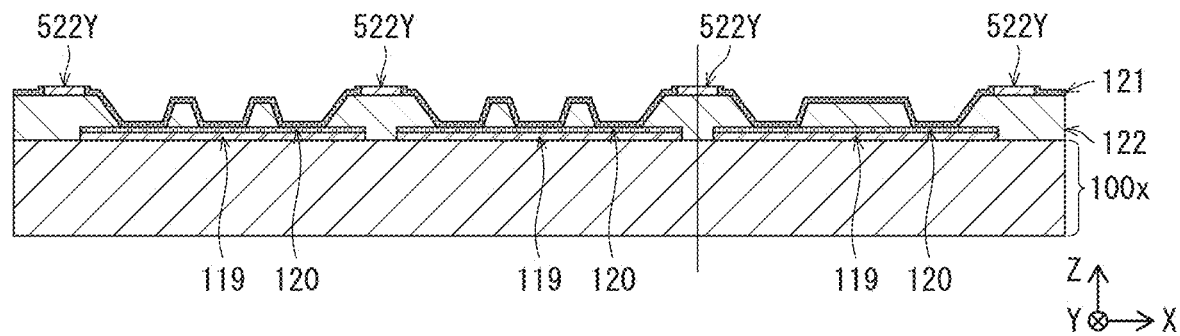
FIGS. 13A to 13D are schematic cross-sectional views of the organic EL display panel 10 during manufacture, taken along a line at the same position as the line B1-B1 in FIG. 4B.

Hole transport layers 121 are formed on the hole injection layers 120 and the insulating layer 122 (FIGS. 10A and 13A). The hole transport layers 121 are formed by applying an ink containing a material of the hole transport layers 121 onto the inside of the gaps 522z, which are defined by the column banks 522Y, with the ink jet method, and then firing the ink. Alternatively, the hole transport layers 121 are formed by depositing metal oxide films such as tungsten oxide films with the sputtering method. Note that, after the deposition, the films may be patterned in units of pixels with the photolithography method and an etching method.

(6) Formation of Light Emitting Layers 123

In the gaps 522z which are defined by the column banks 522Y, light emitting layers 123 and an electron transport layer 124 are formed on the hole transport layers 121 in the stated order.

The light emitting layers 123 are formed by applying an ink containing a material of the light emitting layers 123 onto the inside of the gaps 522z, which are defined by the column banks 522Y, with the ink jet method, and then firing the ink.

Figure 10B:
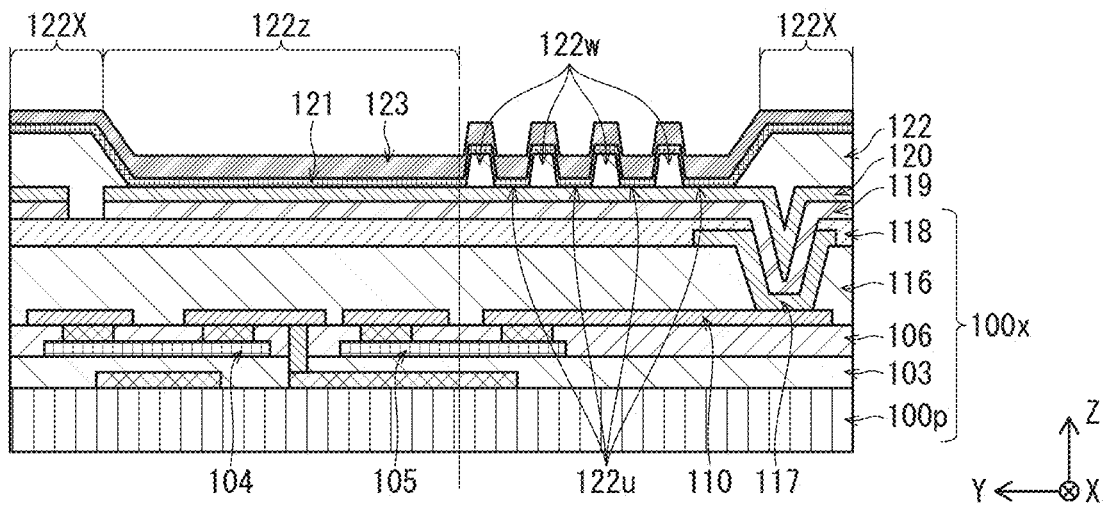
Figure 13B:
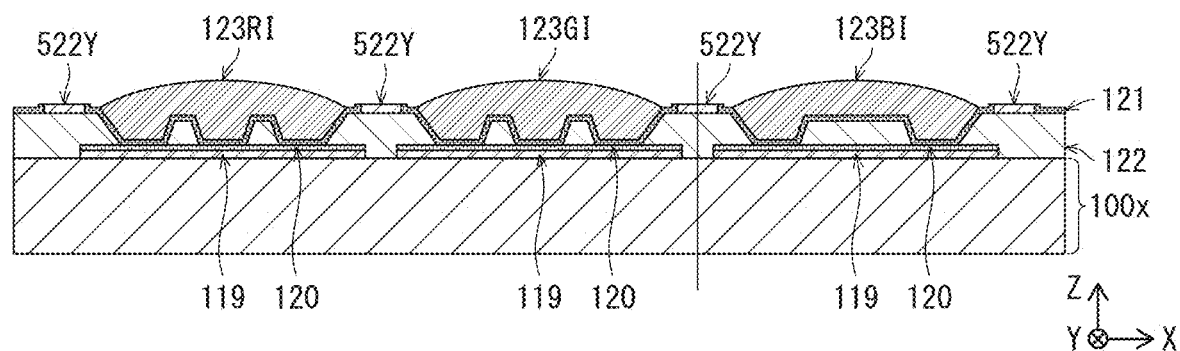
Figure 13C:
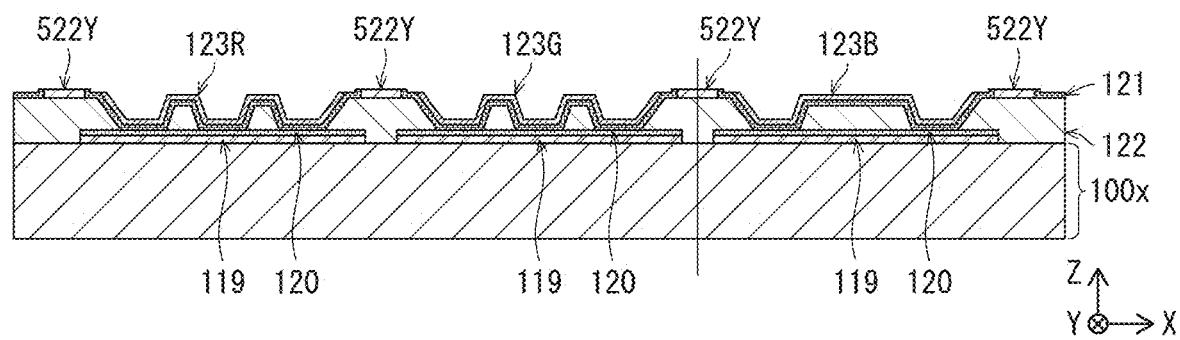

In formation of the light emitting layers 123, a solution for forming the light emitting layers 123 is first applied with use of an ink discharge device. Specifically, light emitting layers of the R, G, and B colors alternate above the substrate 100x in line in the stated order in the lateral direction in the figures. In this process, the gaps 522z, which are regions where subpixels are to be formed, are each filled using the ink jet method with any of inks 123RI, 123GI, and 123BI respectively containing materials of organic light emitting layers of the R, G, and B colors (FIG. 13B). Then, the inks are dried under a reduced pressure and are baked. As a result, the light emitting layers 123R, 123G, and 123B are complete (FIGS. 10B and 13C).

(Method of Applying Solution for Light Emitting Layer Formation)

Figure 15:
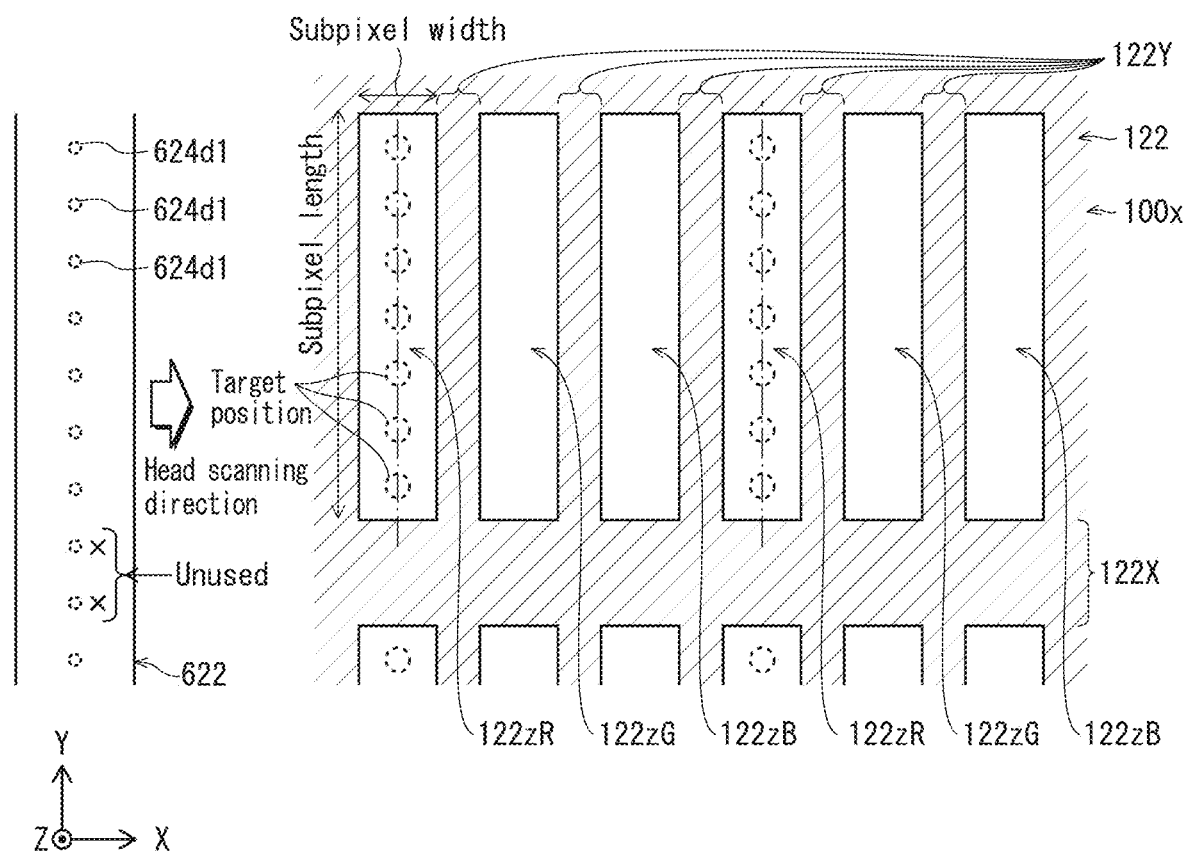
FIG. 15 is a schematic view of the organic EL display panel 10 during manufacture, showing a process of applying inks for light emitting layer formation to regions of a lattice shape above a substrate that are defined by insulating sublayers 122X and 122Y.

The following describes a process of forming the light emitting layers 123 with the ink jet method for mass production. FIG. 15 is a schematic view showing a process of applying inks for light emitting layer formation to regions of a lattice shape above the substrate that are defined by the insulating sublayers 122X and 122Y.

In formation of the light emitting layers 123, light emitting layers of the R, G, and B colors are formed in the regions defined by the banks arranged in lines, with use of three color inks, namely, the red ink 123RI, the green ink 123GI, and the blue ink 123BI, which are solutions for forming the light emitting layers 123.

For the purpose of simplifying the description, the three color inks are applied in order by the following application method. First, one of the inks is applied over substrates. Then, another one of the inks is applied over the substrates. Lastly, the last one of the inks is applied over the substrates.

The following describes an application process of one of the three color inks, namely, the red ink onto substrates as a representative. Note that the red ink is applied to one of each three regions that are adjacent to each other in the X-direction.

According to this application method, the ink is applied to the regions of a lattice shape defined by the insulating sublayers 122X and 122Y. Specifically, as shown in FIG. 15, the substrate 100x is placed such that the longitudinal direction and the width direction of the subpixels 100se respectively coincide with the Y-direction and the X-direction. The ink discharge device performs ink application by, while scanning in the X direction with use of an ink jet head 622, discharging ink from discharge ports 624d1 of the ink jet head 622 toward arrival targets that are set in the regions of a lattice shape which are defined by the insulating sublayers 122X and 122Y. In FIG. 15, the red subpixels 100se include arrival target positions onto which the red ink is to be applied.

Note that, among the discharge ports 624d1 of the ink jet head 622, only discharge ports 624d1, which pass above regions between each two adjacent insulating sublayers 122X, are used. Meanwhile, discharge ports 624d1 (indicated by sign x in FIG. 15), which pass above the insulating sublayers 122X, are always unused. According to the example shown in FIG. 15, seven arrival targets are set in each of the regions of the subpixel, and ink droplets are discharged from seven discharge ports 624d1.

After application of the one of the three color inks over the substrate 100x completes, application of another one of the inks is performed over the same substrate 100x, and lastly application of the last one of the inks is performed above the same substrate 100x. This application process of the three color inks is repeatedly performed for each of the substrates 100x.

Alternatively, the three color inks may be applied in order in the following manner. Specifically, when application of one of the inks above all of the substrates 100x is complete, the application process may be repeatedly performed to apply another one of the inks onto the substrates 100x, and then apply the other ink onto the substrate 100x.

(7) Formation of Electron Transport Layer 124, Counter Electrode Layer 125, and Sealing Layer 126

Figure 10C:
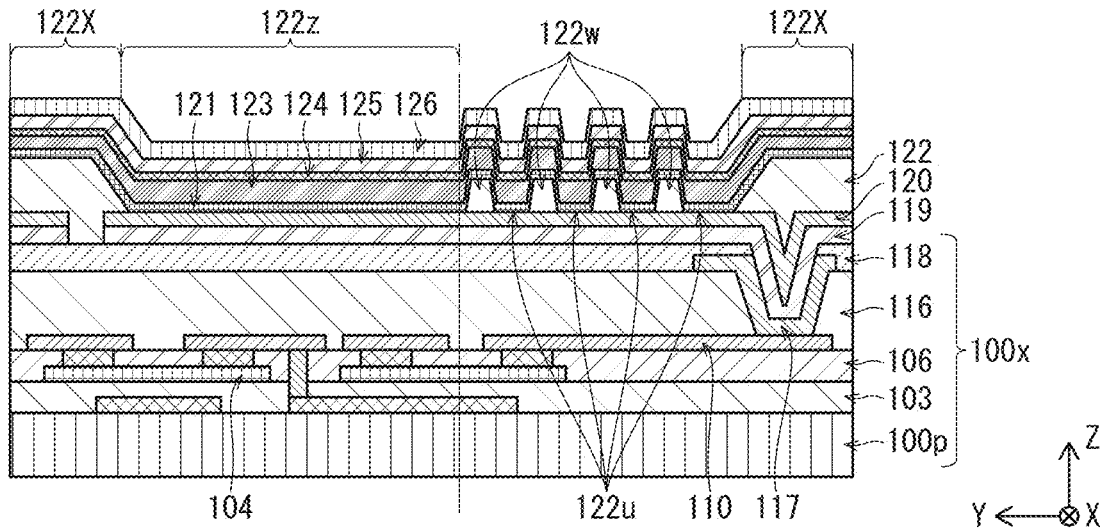
Figure 13D:
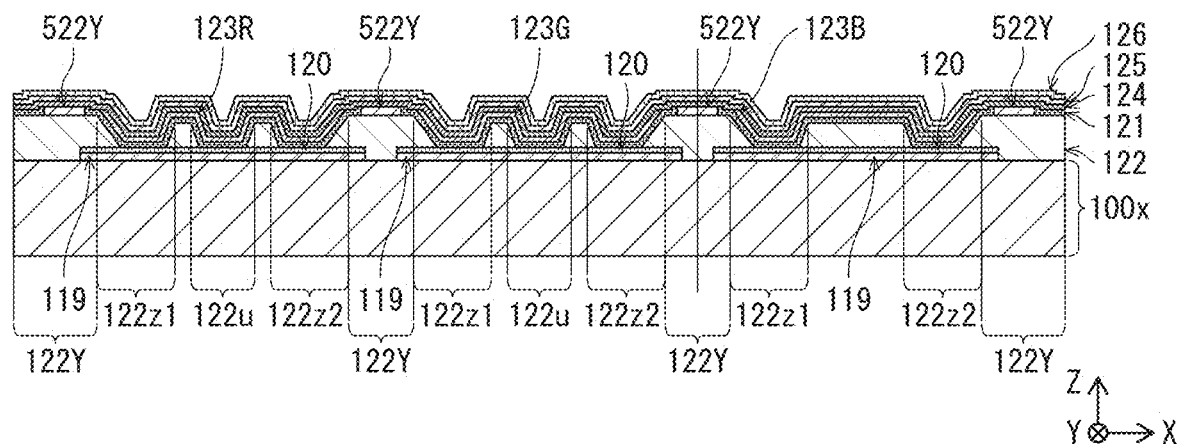

An electron transport layer 124 is formed with the vacuum deposition method or the like. Then, a counter electrode layer 125 and a sealing layer 126 are formed in the stated order so as to cover the electron transport layer 124 (FIGS. 10C and 13D). The counter electrode layer 125 and the sealing layer 126 are formed with the CVD method, the sputtering method, or the like.

(8) Formation of CF Substrate 131

The following exemplifies a process of manufacturing a CF substrate 131 with reference to the figures. FIGS. 16A-16F are schematic cross-sectional views of the organic EL display panel 10 during manufacture, showing manufacturing of the CF substrate 131.

Figure 16A:
FIGS. 16A to 16F are schematic cross-sectional views of the organic EL display panel 10 during manufacture, showing manufacturing of the CF substrate 131.

A light shielding layer paste 129R is prepared by dispersing in a solvent a material of a light shielding layer 129 mainly containing ultraviolet curable resin (for example, ultraviolet curable acrylic resin). The light shielding layer paste 129R is applied onto one of surfaces of a transparent upper substrate 130 (FIG. 16A).

Figure 16B:
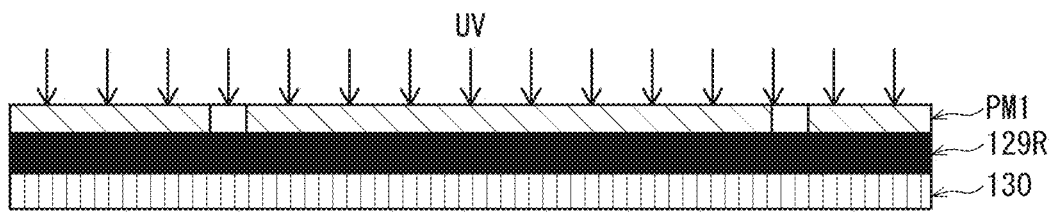

The applied light shielding layer paste 129R is dried and the solvent is vaporized to a certain degree. Then, a pattern mask PM1 having predetermined openings is overlaid above the light shielding layer paste 129R, and ultraviolet irradiation is performed on the pattern mask PM1 (FIG. 16B).

Figure 16C:

Then, the light shielding layer paste 129R, which has been applied and from which the solvent has been removed, is fired, and development is performed for removing the pattern mask PM1 and uncured parts of the light shielding layer paste 129R. Then, the light shielding layer paste 129R is cured. As a result, the light shielding layer 129 having a rectangular cross section is complete (FIG. 16C).

Next, a paste 128R is prepared by dispersing in a solvent a material of color filter layers 128 (for example, color filter layers 128G) mainly containing an ultraviolet curable resin component. The paste 128R is applied to the surface of the upper substrate 130 on which the light shielding layer 129 is formed. The solvent is removed to a certain degree, and then a predetermined pattern mask PM2 is overlaid above the paste 128R and ultraviolet irradiation is performed on the pattern mask PM2 (FIG. 16D).

Then, development is performed for removing the pattern mask PM2 and uncured parts of the paste 128R, and the paste 128R is cured. As a result, the color filter layers 128G are complete (FIG. 16E).

Figure 16D:
Figure 16E:
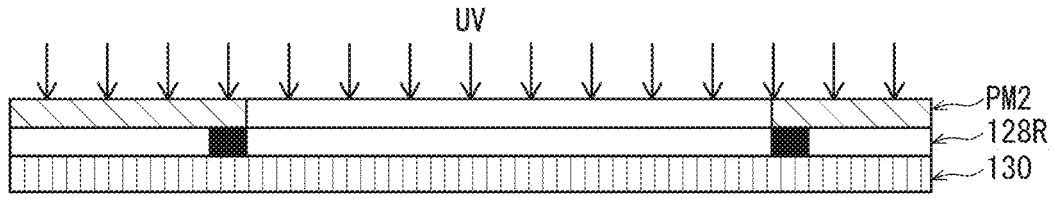
Figure 16F:
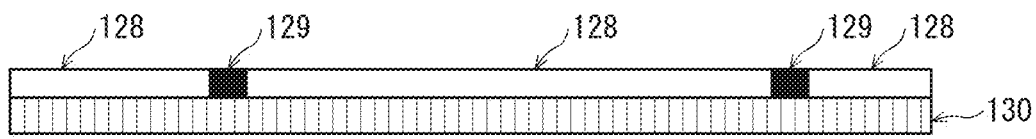

Color filter layers 128R and 128B are also formed by similarly repeating the processes in FIGS. 16D and 16E on color filter materials of the R and B colors. Note that any commercially available color filter products may be used instead of using the paste 128R.

This completes the CF substrate 131.

(9) Bonding of CF Substrate 131 and Rear Panel

Figure 11A:
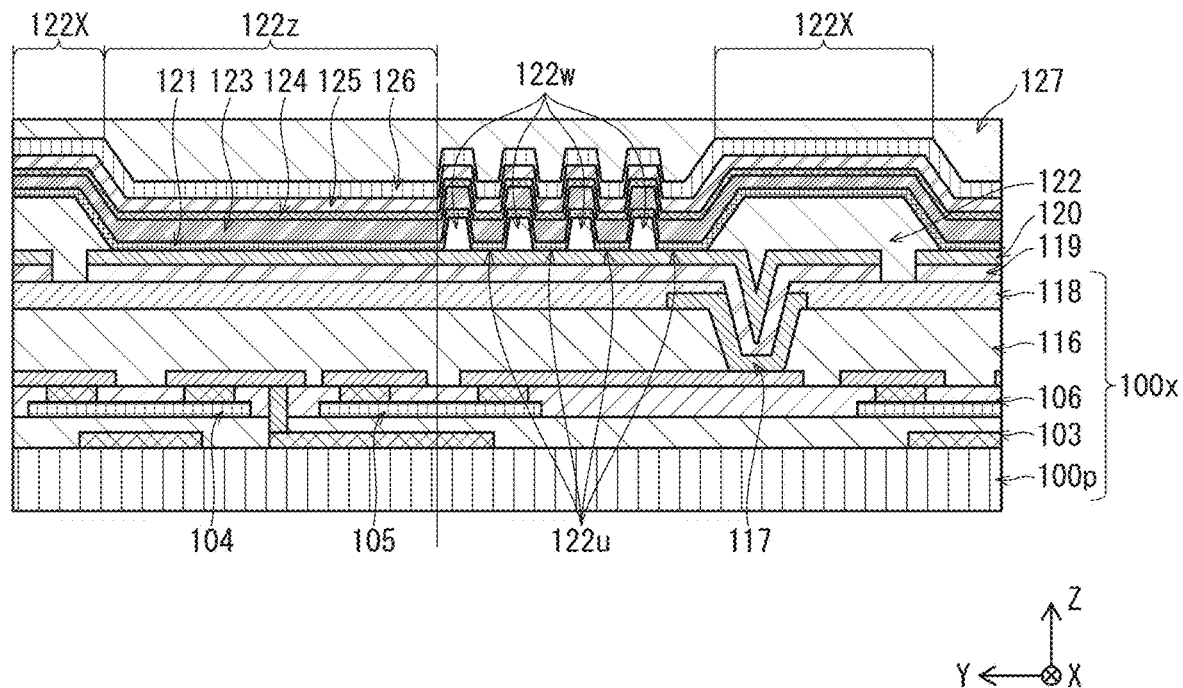
FIGS. 11A and 11B are schematic cross-sectional views of the organic EL display panel during manufacture, taken along a line at the same position as the line A1-A1 in FIG. 4B, showing bonding of a CF substrate 131 to a rear panel.
Figure 11B:
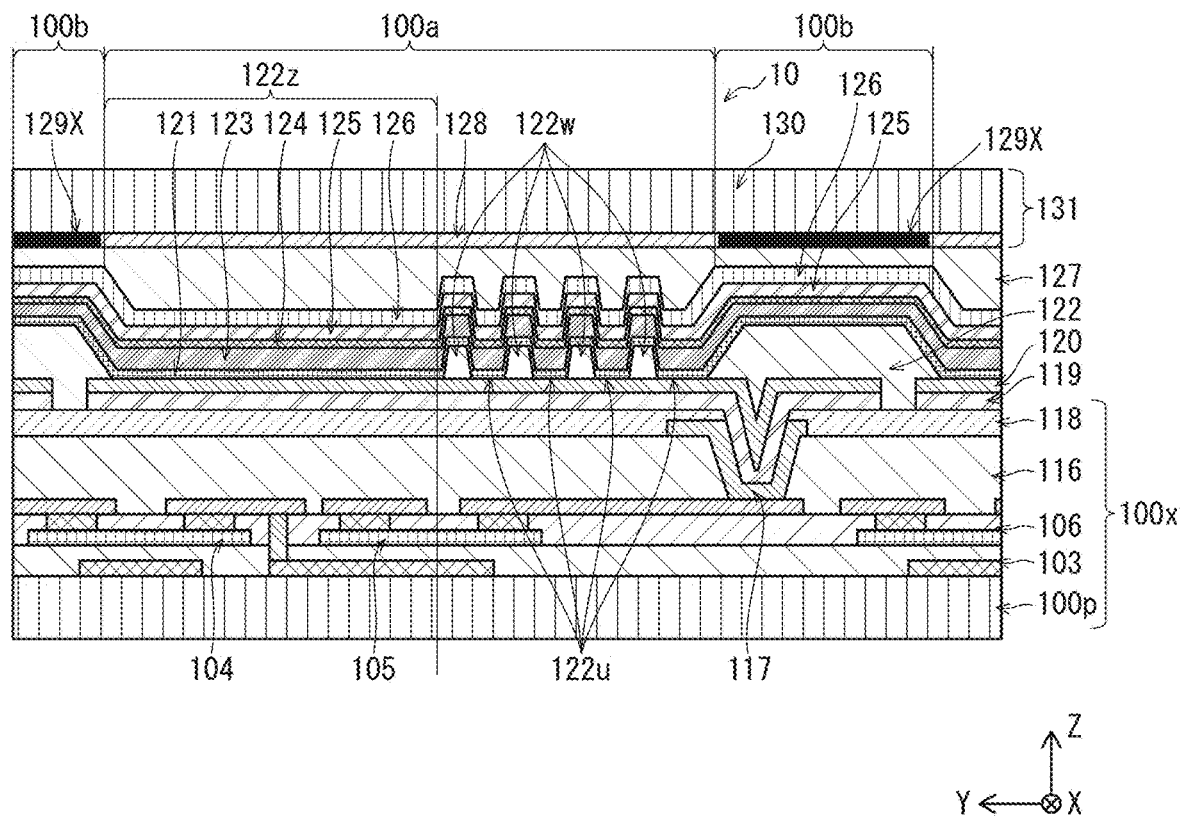
Figure 14A:
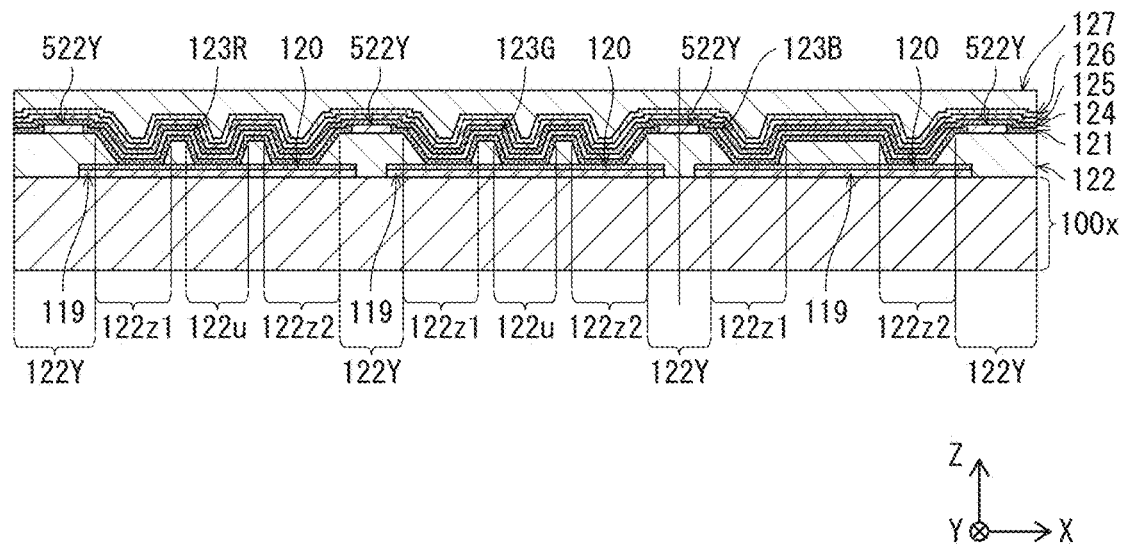
FIGS. 14A and 14B are schematic cross-sectional views of the organic EL display panel 10 during manufacture, taken along a line at the same position as the line B1-B1 in FIG. 4B, showing bonding of the CF substrate 131 to the rear panel.
Figure 14B:
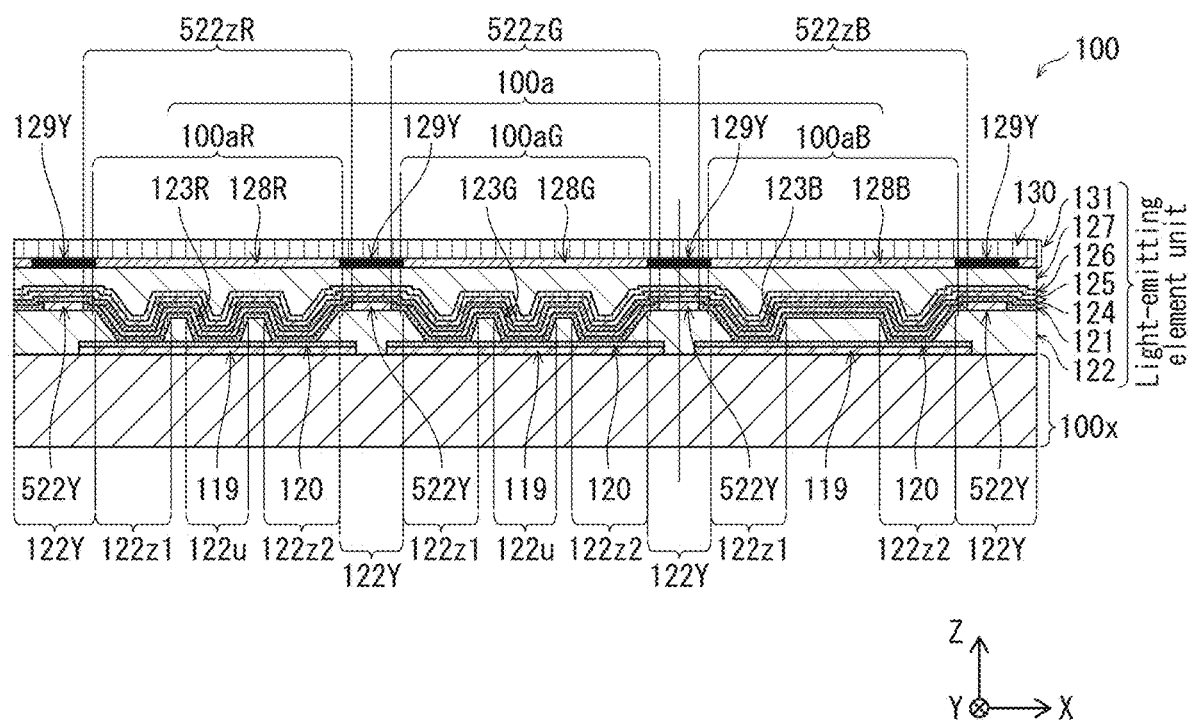

The following describes a bonding process of the CF substrate 131 and a rear panel in manufacturing the display panel 10. FIGS. 11A and 11B are schematic cross-sectional views taken along a line at the same position as the line A1-A1 in FIG. 4B. FIGS. 14A and 14B are schematic cross-sectional views taken along a line at the same position as the line B1-B1 in FIG. 4B.

First, a material of a bond layer 127 mainly containing light-transmissive ultraviolet curable resin is applied to the rear panel, which is composed of the substrate 100x and the layers ranging from the pixel electrode layers 119 to the sealing layer 126 (FIGS. 11A and 14A). The light-transmissive ultraviolet curable resin is for example acrylic resin, silicone resin, or epoxy resin.

Subsequently, ultraviolet irradiation is performed on the applied material such that the CF substrate 131 and the rear panel are bonded to each other while positions relative to each other are maintained. At this time, intrusion of gas therebetween needs to be prevented. Then, the CF substrate 131 and the rear panel are fired. This completes a sealing process (FIGS. 11B and 14B).

The display panel 10 is complete through the above processes.

5. Effect of Display Panel 10

5.1 Display Function

As described above, the insulating layer 122 has, in each of the subpixels 100se, the elongated first openings 122z1 and 122z2, which extend in the column direction and are arranged in the row direction, and the second openings 122u, which are shorter in the column direction than the first openings 122z and are lined up adjacent to the first openings 122z. Organic functional layers including the hole injection layers 120, the light emitting layers 123, and so on are formed in the first openings 122z. The hole injection layers 120 are exposed in the first openings 122z and the second openings 122u so as to be in contact with the hole transport layers 121. This configuration allows electrical charge supply in these openings from the pixel electrode layers 119 to the hole transport layers 121.

Light is emitted from only parts of the light emitting layers 123 to which carriers are supplied from the pixel electrode layers 119, and accordingly no electroluminescence of organic compound occurs in regions of the light emitting layers 123 where the insulating layer 122 is provided, which is made of an insulating material. Thus, light is emitted from only parts of the light emitting layers 123, positioned in the openings 122z and 122u, where no insulating layer 122 is provided. These minimum rectangular regions including the openings 122z and 122u are the luminous regions 100a. Regions other than the luminous regions 100a in the subpixels 100se are the non-luminous regions 100b. In other words, the display panel 10 has the configuration in which the subpixels 100se are arranged in a matrix where the luminous regions 100a and the non-luminous regions 100b alternate in the column direction, owing to the pixel electrode layers 119 layered on the substrate 100x and the openings 122z provided in the insulating layer 122.

Also, the openings 122z and 122u each have a predetermined trapezoidal cross section taken along the row direction whose width increases upward. With this configuration, the light emitting layers 123 efficiently emit light upward.

5.2 Test for Effect Check

The following describes the effects of the display panel 10. The inventors performed a test with use of the display panel 10 in order to suppress an insufficient ink spread in the pixels during a manufacturing process. The following provides comparative description of reflectors of display panels 10 relating to examples with a conventional reflector in terms of light extraction efficiency and ink spread.

(1) Examples 1 and 2

An insulating layer 122 corresponding to a subpixel region 100a of the display panel 10 relating to Example 1 in plan view is the same as that shown in FIG. 4B.

In each of the subpixels in the display panel 10 relating to Example 1, the insulating layer 122 has two first openings 122z1 and 122z2, which are elongated in the column direction, and second openings 122u, which are lined up adjacent to the first openings 122z1 and 122z2. Specifically, nine second openings 122u are provided in regular intervals in the Y-direction. A region including the nine second openings 122u and the first openings 122z1 and 122z constitutes a luminous region. The second openings 122u have a width in the column direction and a width in the row direction that are equal to each other (1:1). The first openings 122z have a width in the column direction that is 20 times a width in the row direction (20:1). The first openings 122z and the second openings 122u have an equal width in the row direction.

In the display panel 10 relating to Example 1, the height of upper edges 122wb of a bar 122w1 between the first opening 122z1 and the second openings 122u and a bar 122w2 between the first opening 122z2 and the second openings 122u is 60% to 70% of the height of an upper edge 122Yb of the insulating sublayer 122Y.

In the display panel 10 relating to Example 2 compared with this, the height of the upper edges 122wb of the bars 122w1 and 122w2 are equal to the height of the upper edge 122Yb of the insulating sublayer 122Y. The display panel 10 relating to Example 2 has the same configuration as the display panel 10 relating to Example 1 other than the height of the bars 122w1 and 122w2.

(2) Light Extraction Efficiency

Luminance magnification of Examples 1 and 2 was calculated.

FIG. 17 shows calculated values of luminance magnification for subpixels. The luminance magnification indicates a luminance value of each sample relative to that of planar subpixels of the same size with no reflector.

As shown in FIG. 17, Examples 1 and 2 both exhibit luminance magnification of 1.47. It is true that the luminance magnification of Examples 1 and 2 is lower than that of Sample A shown in FIG. 20, and specifically its ratio is 1.47/1.6. However, the luminance magnification of Examples 1 and 2 is higher than that of Sample B shown in FIG. 20, and specifically its ratio is 1.47/1.4. Accordingly, the luminance magnification of Examples 1 and 2 is not low enough to damage effects of the reflector.

The reason why Examples 1 and 2 exhibit an improved light extraction efficiency compared with Sample B seems to be the second openings 122u functioning as a preferable reflector with the width in the column direction and the width in the row direction that are close in value to each other.

(3) Ink Spread

Next, regarding the ink spread, the inventors performed a test of forming functional layers using inks of the same amount in order to measure an ink spread rate based on a ratio of an area of the functional layers to an area of the subpixel region 100a. FIG. 17 shows a measurement result of the ink spread rate for the light emitting layers in the subpixels. As shown in FIG. 17, while Example 2 exhibits an ink spread rate of 75%, Example 1 exhibits an ink spread rate of 100%, which is higher than Example 2.

This seems to be because of the following reason. In Example 1, the first opening 122z has no bar that hinders the flow of the ink in the column direction, and thus the ink easily flows in the column direction. Also, since the first openings 122z are elongated and extend in the column direction, air in the first openings 122z easily flows in the column direction, and thus does not hinder the flow of the ink so much. Furthermore, the height of the bars, which hinder the ink flow in the row direction, is low, and this facilitates the ink flow in the row direction. Thus, an ink spreads in the first openings 122z in the column direction, and then further spreads therefrom in the row direction. As a result, the ink spreads over the entire subpixel region 100a. This seems to be the reason why Example 1 exhibits an ink spread rate higher than Example 2.

6. Modification

In the above embodiment, the display panels 10 is described. However, the present disclosure is not limited to the above embodiment except the essential characteristic compositional elements thereof. The following describes a modification of the display panel 10 as an example of such an embodiment, with reference to FIGS. 18A-18H.

(1) Connection Grooves 122v1 Provided in Non-Luminous Regions so as to be Communicated with First Openings 122z in Adjacent Subpixels in Column Direction In the modification of the display panel 10 as shown in FIG. 18A, an insulating layer 122 has, in each of non-luminous regions 100b, a connection groove 122v1 having an upper opening and a bottom. The connection groove 122v1 is communicated with either first openings 122z1 or 122z2 in subpixels adjacent to the non-luminous region 100b in the column direction. The display panel relating to the present modification has the same configuration other than the connection groove 122v1 as that of the display panel 10 relating to the embodiment, and accordingly its description is omitted here.

Also, the connection groove 122v1 may be provided in plural as shown in FIG. 18B. Specifically, in plan view, connection grooves 122v1 and 122v2 may be provided that are respectively communicated with the first openings 122z1 and 122z2 in the column direction.

The connection groove 122v1 with this configuration increases the flow of an ink, which contains organic compound as materials of the light emitting layers 123, in the column direction, thereby to suppress variation in application amount of the ink between the subpixels. As a result, it is possible to suppress luminance unevenness caused by variation in film thickness of the light emitting layers 123 between luminous regions 100a in the subpixels.

Although organic functional layers, which include hole injection layers 120, the light emitting layers 123, and so on, are formed also in the connection grooves 122v1, the hole injection layers 120 are not exposed in the connection grooves 122v1 of the insulating layer 122, which have a groove-shaped cross section and have upper openings and bottoms. Thus, electrical charge supply from the pixel electrode layers 119 to the hole transport layers 121 is not performed in the connection grooves 122v1. Light is emitted from only parts of the light emitting layers 123 to which carriers are supplied from the pixel electrode layers 119, and accordingly no electroluminescence of organic compound occurs in regions of the light emitting layers 123 where the insulating layer 122 is provided, which is made of an insulating material.

(2) Grooves with Increased or Decreased Area

The connection grooves 122v1 and 122v2 in each of the non-luminous regions 100b may have an increased area and a decreased area as respectively shown in FIGS. 18A and 18B. Moreover, the connection grooves 122v1 and 122v2 whose area increases or decreases may be separated from the first openings 122z by a distance 6 in the column direction.

(3) Bridging Grooves 122v0 Communicated with First Openings 122z in Row Direction As shown in FIG. 18C, the grooved portions 122v may include, for each of the non-luminous regions 100b, bridging grooves 122v0 and a connection groove 122v1, in plan view. The bridging grooves 122v0 are communicated with the first openings 122z1 and 122z2 in the row direction, and the connection groove 122v1 is communicated between the bridging grooves 122v0 in the column direction. Also, as shown in FIG. 18D, the bridging groove 122v0 shown in FIG. 18C may have an increased area that is equal to the entire area of the non-luminous region 100b.

The bridging grooves 122v0 with these configurations further increase the flow of the ink, which contains organic compound as materials of the light emitting layers 123, between the first openings 122z and the second openings 122u in the row direction, thereby to suppress variation in application amount of the ink in each subpixel. As a result, it is possible to suppress luminance unevenness caused by variation in film thickness of the light emitting layers 123 between the luminous regions 100a in the subpixels.

(4) Openings in Different Number

In the above modification of the display panel 10, the insulating layer 122 has, above each of the pixel electrode layers 119, the two elongated first openings 122z1 and 122z2, the second openings 122u, and the connection groove 122v with an upper opening and a bottom. The first openings 122z1 and 122z2 extend in the column direction and are arranged in the row direction. The second openings 122u are shorter in the column direction than the first openings 122z1 and 122z2 and are lined up adjacent to the first openings 122z1 and 122z2. The connection groove 122v is communicated with either the first opening 122z1 or 122z2.

Alternatively, the number of the first openings 122z and the number of the rows of the second openings 122u each may be modified. Specifically, a single first opening 122z and a single row of the second openings 122u may be provided (FIG. 18E). Further alternatively, a single first opening 122z and two rows of the second openings 122u with the first opening 122z therebetween may be provided (FIG. 18F). Yet alternatively, two first openings 122z and three rows of the second openings 122u may be provided such that each first opening 122z is sandwiched between two adjacent rows of the second openings 122u (FIG. 18G).

(5) Second Openings 122u with Different Size

As shown in FIG. 18H, second openings 122t may be provided by increasing the size of the second openings 122u shown in FIG. 18A. The second openings 122t are communicated with the first openings 122z1 and 122z2 at row-directional ends 122ta thereof.

With this configuration, it is possible to further increase the flow of the ink in the row direction via the second openings 122u, thereby to suppress variation in application amount of the ink in each subpixel. This suppresses luminance unevenness caused by variation in film thickness of the light emitting layers 123 between the luminous regions 100a in the subpixels.

(6) Connection Grooves 122v and First Openings 122z with the Same Cross-Sectional Profile According to the configurations shown in FIGS. 18A, 18B, 18E, 18F, and 18H, the upper width of the connection grooves 122v in the row direction is equal or substantially equal to the upper width of the first openings 122z in the row direction. Also, the width of the connection grooves 122v in the column direction is 1 µm to 8 µm. In other words, the cross-sectional profiles of the first openings 122z taken along the row direction are uniform in the column direction or continuously vary along the column direction. With this configuration, the connection grooves 122v have substantially the same cross-sectional profile as that of the first openings 122z, and thus it is possible to prevent the connection grooves 122v from influencing ink retention ability at the end edges of the first openings 122z. This further uniformly retains the ink at the end edges of the first openings 122z, and suppresses variation of factors that influence the ink retention ability in application of the ink containing organic compound as materials of the light emitting layers 123 during the manufacturing process. As a result, the ink is retained uniformly in the luminous regions 100a of the subpixels, and thus variation in film thickness of the light emitting layers 123 is reduced to further suppress luminance unevenness in each subpixel.

Other Modifications

Although the display panel 10 has been described in the above embodiment, the present disclosure also includes, for example, an embodiment obtained through various types of modifications which could be conceived of by one skilled in the art to the above embodiment, an embodiment obtained through any combination of the compositional elements and the functions in the above embodiment without departing from the spirit of the present disclosure, and so on. The following describes modifications of the display panel 10 as examples of such an embodiment.

(1) In the display panel 10, the light emitting layers 123 are continuous in the column direction above the row banks. Alternatively, the light emitting layers 123 may not be continuous for the entire pixels above the row banks. Even with this configuration, it is possible to improve the light extraction efficiency.

(2) In the display panel 10, the light emitting layers 123 of the subpixels 100se, which are arranged in the gaps 522z between the column banks 522Y adjacent in the row direction, each emit light of a color different from adjacent one. Meanwhile, the light emitting layers 123 of the subpixels 100se, which are arranged between the insulating sublayers 122X adjacent in the column direction, emit light of the same color. Alternatively, the light emitting layers 123 of the subpixels 100se, which are adjacent in the row direction, may emit light of the same color, and the light emitting layers 123 of the subpixels 100se, which are adjacent in the column direction, each may emit light of a color different from adjacent one. Further alternatively, the light emitting layers 123 of the subpixels 100se, which are adjacent in the row direction, each may emit light of a color different from adjacent one, and the light emitting layers 123 of the subpixels 100se, which are adjacent in the column direction, each may emit light of a color different from adjacent one. Even with this configuration, it is possible to improve the light extraction efficiency.

(3) Others

The display panel 10 relating to the above embodiment includes the subpixels 100se of the three colors of red, green, and blue. However, the present disclosure is not limited to this. For example, the light emitting layers may be ones emitting light of a single color, or respective ones emitting light of four colors of red, green, blue, and yellow.

Also, the unit pixels 100e are arranged in a matrix in the above embodiment. However, the present disclosure is not limited to this. The effect of the present disclosure is exhibited also for the configuration in which in the case for example where an interval of the pixel region is one pitch, the pixel region is shifted in the column direction by half pitch between adjacent gaps. In display panels with increasing high resolution, since it is difficult to visually discriminate some shift in the column direction, an irregular film thickness in a straight (or staggered) shape with a certain width is viewed as a stripe-shaped one. Thus, in such a case, it is possible to improve the display quality of the display panels by suppressing an irregular luminance in a staggered shape such as described above.

Also, the display panel 10 includes the pixel electrode layers 119 each of which are provided between every two of all the gaps 522z. However, the present disclosure is not limited to this. For example, some of the gaps 522z may not have the pixel electrode layer 119 therebetween in order to form a bus bar or the like.

Moreover, the display panel 10 includes the color filter layers 128 that are provided above the gaps 522z corresponding to the subpixels 100se of the R, G, and B colors. Alternatively, the exemplified display panel 10 may have a configuration in which the color filter layers 128 are not provided above the gaps 522z.

Also, in the above embodiment, the hole injection layers 120, the hole transport layers 121, the light emitting layers 123, and the electron transport layer 124 are provided between each of the pixel electrode layers 119 and the counter electrode layer 125. However, the present disclosure is not limited to this. For example, only the light emitting layers 123 may be provided between each of the pixel electrode layers 119 and the counter electrode layer 125, without providing the hole injection layers 120, the hole transport layers 121, and the electron transport layer 124. Alternatively, hole injection layers, a hole transport layer, an electron transport layer, an electron injection layer, and so on may be included, or some or all of these layers may be simultaneously included, for example. Moreover, all of these layers do not need to be made of organic compound, and alternatively some of the layers may be made of inorganic substance or the like. Furthermore, the hole injection layers 120, the hole transport layers 121, and the electron transport layer 124 may be formed using a dry deposition method such as the vacuum deposition method, an electron beam deposition method, the sputtering method, a reactive sputtering method, an ion plating method, and a chemical vapor deposition method. Also, in the case where the hole injection layers 120 and the hole transport layers 121 are formed using the dry deposition method, the pixel electrode layers 119, the hole injection layers 120, the hole transport layers 121, the insulating layer 122, and the light emitting layers 123 may be layered in the stated order.

Also, in the above embodiment, the light emitting layers 123 are formed using a wet deposition method such as the printing method, the spin coating method, and the ink jet method. However, the present disclosure is not limited to this. For example, the dry deposition method may be used such as the vacuum deposition method, the electron beam deposition method, the sputtering method, the reactive sputtering method, the ion plating method, and the chemical vapor deposition method. Moreover, a known material may be appropriately adopted for the materials of the components.

Also, in the above embodiment, the pixel electrode layers 119 as anodes are provided in the lower part of the organic EL element unit so as to be connected with the source electrodes of the TFTs. Alternatively, the counter electrode layer and the anodes may be provided respectively in the lower part and the upper part of the organic EL element unit. In this case, the cathode that is provided in the lower part is connected with the drain electrodes of the TFTs.

Also, the two transistors $Tr_1$ and $Tr_2$ are provided for each subpixel 100se in the above embodiment. However, the present disclosure is not limited to this. For example, one transistor may be provided for each subpixel, or three or more transistors may be provided for each subpixel.

Furthermore, an EL display panel of the top-emission type is exemplified in the above embodiment. However, the present disclosure is not limited to this. For example, the present disclosure may be applied to a display panel of a bottom-emission type. In this case, the configurations of the components may be appropriately modified.

Also, in the above embodiment, the display panel 10 is an active-matrix display panel. However, the present disclosure is not limited to this. For example, the display panel 10 may be a passive-matrix display panel. Specifically, pairs of a linear electrode, which is parallel to the column direction, and a linear electrode, which is parallel to the row direction, may be provided such that each pair of the electrodes sandwich the light emitting layer 123 therebetween. In this case, the configurations of the components may be appropriately modified. Although the substrate 100x in the above embodiment includes the TFT layer, the substrate 100x does not necessarily need to include the TFT layer as seen in the above example of the passive-matrix display panel.

<<Supplements>>

The embodiment described above shows a specific preferred example of the present disclosure. The numerical values, the shapes, the materials, the components, the arrangement and connection status of the components, the processes, the order of the processes, and so on described in the above embodiment are just examples, and do not intend to limit the present disclosure. Also, processes among the components in the embodiment, which are not described in the independent claims representing the most generic concept of the present disclosure, are explained as arbitrary components of a more preferred embodiment.

Furthermore, the order of performing the above processes is exemplification for specifically describing the present disclosure, and the processes may be performed in an order different from the above one. Moreover, part of the above processes may be performed simultaneously (in parallel) with other process.

Also, the components shown in the figures in the above embodiment are not necessarily drawn to scale for easy understanding of the present disclosure. Furthermore, the present disclosure is not limited by the description of the above embodiment, and may be appropriately modified without departing from the scope of the present disclosure.

Moreover, at least part of the functions of the above embodiment and modifications may be combined with each other.

Furthermore, the present disclosure also includes embodiments obtained through various types of modifications that could be conceived of by one skilled in the art to the above embodiment.

INDUSTRIAL APPLICABILITY

The organic EL display panel and the organic EL display device relating to the present disclosure are broadly utilizable to devices such as television sets, personal computers, and mobile phones, or other various types of electrical devices having display panels.

REFERENCE SIGNS LIST

1 Organic EL display device
10 Organic EL display panel
100 Organic EL element
100e Unit pixel
100se Subpixel
100a Luminous region
100b Non-luminous region
100x Substrate (TFT substrate)
100p Lower substrate
101, 102 Gate electrode
103 Gate insulating layer
104, 105 Channel layer
106 Channel protection layer
107, 110 Source electrode
108, 109 Drain electrode
111 Source lower electrode
112 Drain lower electrode
113 Contact plug
116 Passivation layer
117 Connection electrode layer
118 Interlayer insulating layer
119 Pixel electrode layer
119a1, 119a2, 119a3, 119a4 Outer edge
119b Contact region (contact window)
119c Connection concave part
120 Hole injection layer
121 Hole transport layer
122, 122X, 122Y Insulating layer
122z Opening
122w Bar
123 Light emitting layer
124 Electron transport layer
125 Counter electrode layer
126 Sealing layer
127 Bond layer
128 Color filter layer
129 Light shielding layer
129X Row light shielding sublayer
129Y Column light shielding sublayer
130 Upper substrate
131 CF substrate
522Y Column bank
522z Gap
622 Ink jet head
624 Discharge port
EL EL element unit
$Tr_1$ Drive transistor
$Tr_2$ Switching transistor
C Capacitance

The invention claimed is:

1. An organic electroluminescence (EL) display panel including pixels arranged in a matrix of rows and columns, the organic EL display panel comprising:
   a substrate;
   pixel electrode layers that are made of a light-reflective material and are arranged on the substrate in the matrix;
   an insulating layer that is provided above the substrate and the pixel electrode layers;
   organic functional layers that are provided above the pixel electrode layers; and
   a light-transmissive counter electrode layer that is provided above the organic functional layers, wherein
   the insulating layer has a first opening and second openings for each of the pixel electrode layers, the first opening being elongated in a column direction, the second openings each being shorter than the first opening in the column direction and being lined up adjacent to the first opening,
   the insulating layer further has a third opening for each of the pixel electrode layers, the third opening being elongated in the column direction,
   the second openings are disposed between the first opening and the third opening in a row direction, and
   the organic functional layers include light-emitting layers in which organic electroluminescence occurs in the first opening, the third opening and the second openings.

2. The organic EL display panel of claim 1, wherein
   an upper edge of a wall of the first opening that is adjacent to the second openings in the row direction is lower in height than an upper edge of a wall of the first opening that faces the wall of the first opening that is adjacent to the second openings in the row direction, and
   an upper edge of a wall of the third opening that is adjacent to the second openings in the row direction is lower in height than an upper edge of a wall of the third opening that faces the wall of the third opening that is adjacent to the second openings in the row direction.

3. The organic EL display panel of claim 2, wherein
   the wall of the first opening that faces the adjacent wall of the first opening is smaller in gradient than the wall of the first opening that is adjacent to the second openings, and the wall of the third opening that faces the adjacent wall of the third opening is smaller in gradient than the wall of the third opening that is adjacent to the second openings.

4. The organic EL display panel of claim 2, wherein
the first opening and the third opening have a width in the row direction that increases upward, and
the second openings have a width in the row direction and a width in the column direction that increase upward.

5. The organic EL display panel of claim 4, further comprising
a bond layer that is provided above the counter electrode layer and has a rear surface that is convex along the first, second, and third openings, and
when refractive indices of the bond layer and the insulating layer are represented by $n_1$ and $n_2$, respectively, the following relationships are satisfied:

$1.1 \leq n_1 \leq 1.8$ (Formula 1); and $|n_1 - n_2| \geq 0.20$ (Formula 2).

6. The organic EL display panel of claim 4, wherein
when depth, upper width in the row direction, and lower width in the row direction of the first, second, and third openings are represented by D, $W_h$, and $W_1$, respectively, the following relationships are satisfied:

$0.5 \leq W_1/W_h \leq 0.8$ (Formula 3); and $0.5 \leq D/W_1 \leq 2.0$ (Formula 4).

7. An organic electroluminescence (EL) display panel comprising:
a plurality of subpixels arranged in a matrix having a row direction and a column direction, wherein a subpixel of the plurality of subpixels comprises:
a pixel electrode layer, wherein the pixel electrode layer comprises a light-reflective material;
an insulating layer over the pixel electrode layer, wherein the insulating layer has a first opening and a plurality of second openings, the first opening being elongated in a column direction, each of the plurality of second openings each being shorter than the first opening in the column direction, second openings of the plurality of second openings are lined up adjacent to the first opening, and the first opening extends beyond all second openings of the plurality of second openings in the column direction;
an organic functional layer over the pixel electrode layer, wherein the organic functional layer comprises a light-emitting layer in which organic electroluminescence is configured to occur in the first opening and the plurality of second openings; and
a light-transmissive counter electrode layer over the organic functional layer.

* * * * *